United States Patent
Lee et al.

(10) Patent No.: US 11,049,547 B1
(45) Date of Patent: *Jun. 29, 2021

(54) NON-VOLATILE MEMORY DEVICE, OPERATING METHOD THEREOF, AND STORAGE DEVICE INCLUDING THE NON-VOLATILE MEMORY DEVICE

(71) Applicant: SAMSUNG ELECTRONICS CO., LTD., Suwon-si (KR)

(72) Inventors: Han-Jun Lee, Gyeonggi-Do (KR); Seung-Bum Kim, Gyeonggi-Do (KR); Chul-Bum Kim, Seoul (KR); Seung-Jae Lee, Gyeonggi-Do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/986,019

(22) Filed: Aug. 5, 2020

(51) Int. Cl.
| | |
|---|---|
| G11C 11/408 | (2006.01) |
| G11C 11/4099 | (2006.01) |
| G11C 11/4093 | (2006.01) |
| G11C 11/4074 | (2006.01) |
| G11C 5/02 | (2006.01) |
| G11C 29/02 | (2006.01) |
| G11C 29/50 | (2006.01) |

(52) U.S. Cl.
CPC .......... *G11C 11/4085* (2013.01); *G11C 5/025* (2013.01); *G11C 11/4074* (2013.01); *G11C 11/4093* (2013.01); *G11C 11/4099* (2013.01); *G11C 29/021* (2013.01); *G11C 29/50004* (2013.01)

(58) Field of Classification Search
CPC ... G11C 11/4085; G11C 29/021; G11C 5/025; G11C 29/50004; G11C 11/4093; G11C 11/4099; G11C 11/4074
See application file for complete search history.

(56) References Cited

U.S. PATENT DOCUMENTS

| | | | |
|---|---|---|---|
| 7,535,765 B2 | 5/2009 | Maayan | |
| 8,149,623 B2 | 4/2012 | Uchikawa et al. | |
| 8,370,719 B2 | 2/2013 | Nelson et al. | |
| 8,576,624 B2 | 11/2013 | Dutta et al. | |

(Continued)

FOREIGN PATENT DOCUMENTS

JP 2006-114078 A 4/2006

*Primary Examiner* — Tri M Hoang
(74) *Attorney, Agent, or Firm* — Volentine, Whitt & Francos, PLLC

(57) ABSTRACT

A memory device includes multiple word lines. A method of operating the memory device includes: performing a first dummy read operation, with respect to first memory cells connected to a first word line among the word lines, by applying a dummy read voltage, having an offset level of a first level, to the first word line; determining, based on a result of the performing of the first dummy read operation, degradation of a threshold voltage distribution of the first memory cells; adjusting an offset level of the dummy read voltage as a second level, based on a result of the determining of the threshold voltage distribution; and performing a second dummy read operation with respect to second memory cells connected to a second word line among the word lines, by applying a dummy read voltage, having the offset level adjusted as the second level, to the second word line among the word lines.

18 Claims, 23 Drawing Sheets

(56) References Cited

U.S. PATENT DOCUMENTS

| | | | |
|---|---|---|---|
| 9,632,868 B2 | 4/2017 | Song | |
| 10,734,082 B2 * | 8/2020 | Lee | ............................ G11C 8/14 |
| 2016/0372161 A1 | 12/2016 | Chae | |
| 2019/0042356 A1 * | 2/2019 | Chen | ........................ G11C 16/26 |
| 2020/0006270 A1 * | 1/2020 | Lee | ...................... H01L 23/5226 |

* cited by examiner

FIG. 12

| OFFSET LEVEL COMPENSATION CRITERION (OLC_CRIT) ||
|---|---|
| ADJACENCY | OLC_TABLE |
| SAME WL | OLC_TABLE_1 |
| ADJACENT WL | OLC_TABLE_2 |
| ADJACENT SSL | OLC_TABLE_3 |
| ADJACENT WL&SSL | OLC_TABLE_4 |
| ⋮ | ⋮ |

FIG. 15

| OFFSET LEVELCOMPENSATION TABLE (OLC_TABLE) ||
| --- | --- |
| DDD RANGE | OFFSET LEVEL COMPENSATION VALUE |
| $0 \leq DDD\_ref1-DDD < d$ | OL_11 |
| $d \leq DDD\_ref1-DDD < 2d$ | OL_12 |
| ⋮ | ⋮ |
| $(N-1)d \leq DDD\_ref1-DDD < Nd$ | OL_1N |
| $0 \leq DDD\_ref2-DDD < d$ | OL_21 |
| $d \leq DDD\_ref2-DDD < 2d$ | OL_22 |
| ⋮ | ⋮ |
| $(N-1)d \leq DDD\_ref2-DDD < Nd$ | OL_2N |
| ⋮ | ⋮ |

FIG. 16

| OFFSET LEVEL COMPENSATION TABLE (OLC_TABLE) ||
|---|---|
| DDD RANGE | OFFSET LEVEL COMPENSATION VALUE |
| $0 \leq DDD\_ref1-DDD<d$ | $dV\_WL$ |
| $d \leq DDD\_ref1-DDD<2d$ | $2 \cdot dV\_WL$ |
| $0 \leq DDD\_ref2-DDD<d$ | $dV\_WL$ |
| $d \leq DDD\_ref2-DDD<2d$ | $2 \cdot dV\_WL$ |
| $0 \leq DDD\_ref3-DDD<d$ | $dV\_WL$ |
| $d \leq DDD\_ref3-DDD<2d$ | $2 \cdot dV\_WL$ |
| $0 \leq DDD\_ref4-DDD<d$ | $dV\_WL$ |
| $d \leq DDD\_ref4-DDD<2d$ | $2 \cdot dV\_WL$ |
| $0 \leq DDD\_ref5-DDD<d$ | $dV\_WL$ |
| $d \leq DDD\_ref5-DDD<2d$ | $2 \cdot dV\_WL$ |

NON-VOLATILE MEMORY DEVICE, OPERATING METHOD THEREOF, AND STORAGE DEVICE INCLUDING THE NON-VOLATILE MEMORY DEVICE

BACKGROUND

1. Technical Field

The present disclosure relates to a non-volatile memory device and a storage device. More particularly, the present disclosure relates to a method of operating a non-volatile memory device and a storage device including the non-volatile memory device.

2. Description of the Related Art

Semiconductor memory devices may be classified into volatile memory devices and non-volatile memory devices. Volatile memory devices store data which is erased when the volatile memory devices are out of power supply. Non-volatile memory devices store data which is not erased when the non-volatile memory devices are out of power supply. Although volatile memory devices read and write data faster than non-volatile memory devices as a general matter, when the volatile memory devices are out of power supply, data stored in the memory devices is erased. On the other hand, although non-volatile memory devices read and write data slower than the volatile memory devices as a general matter, data stored in the memory devices is preserved even when the non-volatile memory devices are out of power supply.

An example of a non-volatile memory device is a flash memory device. In a flash memory device, as the number of bits of data stored in one memory cell increases, a threshold voltage distribution of memory cells included in the memory device is more elaborately formed. For example, the threshold voltage distribution may become more complex and/or more detailed, and/or may include more directional variations. Changes in threshold voltage distribution can result in defects like read errors.

SUMMARY

The present disclosure provides a method of operating a memory device, a memory device, and a storage device including the memory device. More particularly, the present disclosure provides a method and a device for performing a data read operation with high reliability when a threshold voltage distribution of memory cells is formed to be different from an expected threshold voltage distribution.

According to another aspect of the present disclosure, a method of operating a memory device includes performing, in a first read operation, a first dummy read operation with respect to first memory cells connected to a first word line among multiple word lines, by applying a dummy read voltage having an offset level of a first level to the first word line among multiple word lines. The method also includes determining, based on read results of the performing of the first dummy read operation, degradation of a threshold voltage distribution of the first memory cells connected to the first word line. The method further includes adjusting an offset level of the dummy read voltage as a second level, based on a result of the determining of the degradation of the threshold voltage distribution of the first memory cells. In a second read operation, a second dummy read operation is performed with respect to second memory cells connected to a second word line among the word lines, by applying a dummy read voltage, having the offset level adjusted as the second level, to the second word line.

According to another aspect of the present disclosure, a memory device includes a memory cell array, a page buffer circuit, a cell counter, and a control logic circuit. The memory cell array includes multiple memory cells connected to multiple word lines. The page buffer circuit includes multiple page buffers respectively connected to first memory cells connected to a first word line among the word lines. The page buffers are configured to store results of reading with respect to the first memory cells during performing the first dummy read operation in the first read operation with respect to the first memory cells. The cell counter is connected to the page buffer circuit and is configured to perform a first cell counting operation, according to the result of reading, corresponding to the first dummy operation. The control logic circuit is configured to determine degradation of a threshold voltage distribution of the first memory cells, based on count information received from the counter and representing a result of the performing of the cell counting operation. The control logic circuit is also configured to store a result of the determining, and adjust an offset level of a dummy read voltage used for a second dummy read operation, based on the stored result of the determining, in a second read operation with respect to second memory cells connected to a second word line among the word lines.

According to another aspect of the present disclosure, a storage device includes a memory device and a memory controller. The memory device is configured to perform a cell counting operation with respect to first memory cells included in a first word line by performing a first dummy read operation in a first read operation and transmit a result of the performing of the cell counting operation to the memory controller as count information. The memory controller is configured to control the memory device to determine degradation degree of a threshold voltage distribution of the first memory cells based on the count information received from the memory device. The memory controller is also configured to adjust an offset level of a dummy read voltage used for a second dummy operation in a second read operation by comparing the determined degradation degree of the threshold voltage distribution to an offset level compensation table stored in the memory device. The second read operation including the second dummy read operation is performed based on the adjusted offset level.

BRIEF DESCRIPTION OF THE DRAWINGS

Embodiments of the present disclosure will be more clearly understood from the following detailed description taken in conjunction with the accompanying drawings in which:

FIG. 12 illustrates offset level compensation criterion according to an example embodiment;

FIG. 15 illustrates an offset level compensation table according to an example embodiment;

FIG. 16 illustrates an offset level compensation table according to an example embodiment;

DETAILED DESCRIPTION OF THE EMBODIMENTS

The inventive concept(s) of the present disclosure now will be described more fully hereinafter with reference to the accompanying drawings, in which example embodiments of the present disclosure are shown.

Figure 1:
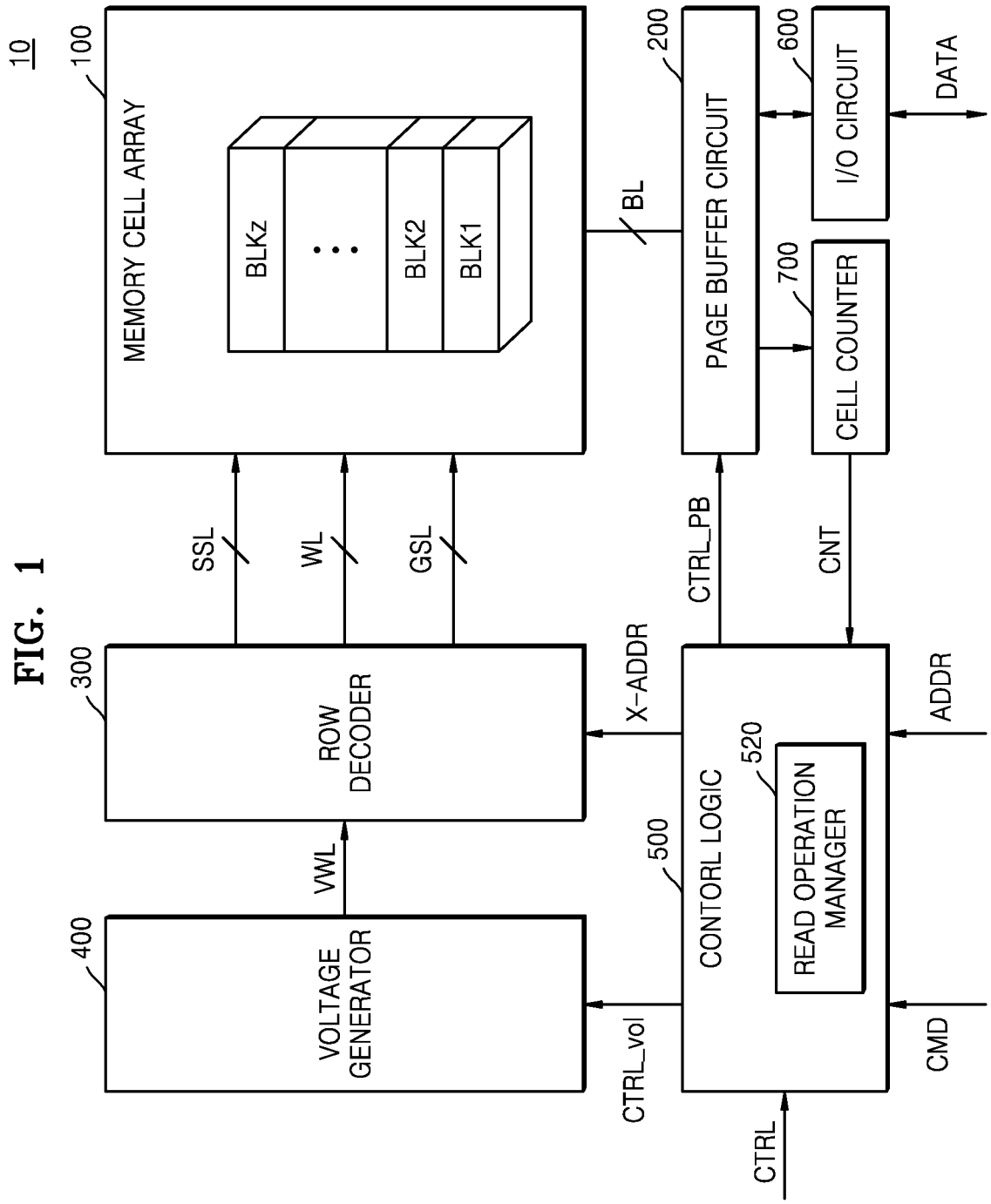
FIG. 1 illustrates a memory device according to an embodiment.

FIG. 1 illustrates a memory device 10 according to an example embodiment. The memory device 10 may include a memory cell array 100, a page buffer circuit 200, a row decoder 300, a voltage generator 400, a control logic 500 (e.g., a control logic circuit), an input/output circuit 600, and a cell counter 700. Although the memory device 10 is illustrated as including only one memory cell array 100, it is only for convenience of description and the memory device 10 is not limited thereto. For example, the memory device 10 may include multiple memory cell arrays.

In FIGs. herein including FIG. 1, circuitry may be shown as, for example, "logic", a "circuit", a "controller", a "counter", a "block", and a "unit". As is traditional in the field of the inventive concept(s) described herein, examples may be described and illustrated in terms of blocks which carry out a described function or functions. These blocks, which may be referred to herein as "logic", a "circuit", a "controller", a "counter", a "block", a "unit" or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the examples may be physically separated into two or more interacting and discrete blocks without departing from the scope of the inventive concepts. Likewise, the blocks of the examples may be physically combined into more complex blocks without departing from the scope of the inventive concepts.

The memory cell array 100 may include multiple memory cells arranged in areas where multiple word lines WLs and multiple bit lines BLs cross. The memory cells may be non-volatile memory cells. Each of the memory cells may be a multi-level cell storing 2-bit data. However, the memory cells are not limited thereto; each of the memory cells may be a triple level cell (TLC) storing 3-bit data, a quadruple level cell (QLC) storing 4-bit data, or a cell storing greater bit data. However, the memory cells are not limited thereto; for example, some of the memory cells may be single level cells (SLCs) storing 1-bit data, and other memory cells may be cells storing data greater than 2-bit data. According to types of memory cells included in the memory cell array 100, the memory device 10 may include NAND flash memory, Vertical NAND (VNAND), NOR flash memory, resistive random-access memory (RRAM), phase-change random-access memory (PRAM), magnetoresistive random-access memory (MRAM), ferroelectric random-access memory (FRAM), spin transfer torque random-access memory (STT-RAM), and combinations thereof.

The memory cell array 100 may include multiple memory blocks BLK1 through BLKz. Each of the memory blocks BLK1 through BLKz may include multiple memory cells. The memory cell array 100 may, through word lines WLs, string selection lines SSLs, and ground selection lines GSL, be connected with the row decoder 300, and may also be connected to the page buffer circuit 200 through bit lines BLs. The memory cell array 100 may include strings connected to each of the bit lines BLs. Each of the strings may include at least one string selection transistor SST, multiple memory cells MCEL, and at least one ground selection transistor GST, which are serially connected between the bit line and a common source line CSL.

The page buffer circuit 200 may be connected to the memory cell array 100 through the bit lines BLs, and may, in response to a page buffer control signal CTRL_PB received from the control logic 500, perform a data write operation or a data read operation. The page buffer circuit 200 may be connected to the data line by selecting a bit line by using a decoded column address. The page buffer circuit 200 may store results of reading the memory cells MCEL, and output page buffer signals according to the stored results. The page buffer circuit 200 may include multiple page buffers. In an embodiment, each of the page buffers may be connected to one bit line, and multiple bit lines included in one bit line group may share one (i.e., the same) page buffer.

The row decoder 300 may select some word lines from among the word lines WLs, based on row-address X-ADDR. The row decoder 300 may transmit a word line application voltage to the word lines WLs. In a data write operation, the row decoder 300 may apply a program voltage and a verification voltage to selected word lines, and apply a program inhibit voltage to unselected word lines. In a data read operation, the row decoder 300 may apply a read voltage to selected word lines, and apply a read inhibit voltage to unselected word lines. In a data erase operation, the row decoder 300 may apply a word line erase voltage to the word lines. In addition, the row decoder 300 may, based on a row address X-ADDR, select some string selection lines from among the string selection lines SSLs, or select some ground selection lines from the ground selection lines GSLs.

The voltage generator 400 may generate various kinds of voltages for performing a write operation, a read operation, and an erase operation on the memory cell array 100 based on a voltage control signal CTRL_vol received from the control logic 500. The generated voltages may be applied to word lines in sensing operations as word line voltages. In this case, a word line driving voltage VWL may include a read voltage, a write voltage, a word line erase voltage, and a write verification voltage, and so on. In addition, the voltage generator 400 may further generate a string selection line driving voltage for driving the string selection lines SSL.

A command CMD, an address ADDR, and a control signal CTRL are received from a memory controller arranged outside of the memory device 10. The control logic 500 may output various kinds of internal control signals for writing data to the memory cell array 100 or reading data from the memory cell array 100 based on the command CMD, the address ADDR and the control signal CTRL. In other words, the control logic 500 may control overall operations in the memory device 10. Various internal control signals output from the control logic 500 may be provided to the page buffer circuit 200, the row decoder 300, the voltage generator 400, and so on. For example, the control logic 500 may provide a page buffer control signal CTRL_PB to the page buffer circuit 200, provide a row address X-ADDR to the row decoder 300, and provide a voltage control signal CTRL_vol to the voltage generator 400. However, types of the internal control signals are not limited thereto, and the control logic 500 may further provide other internal control signals. For example, the control logic 500 may provide a column address to a column decoder.

The control logic 500 may include a read operation manager 520. The read operation manager 520 may control data read operations of the memory device 10. For example, when the memory device 10 performs a data read operation, the read operation manager 520 may, by using a voltage control signal CTRL_vol, control a read voltage applied to the word lines WLs.

The input/output circuit 600 may be connected to the page buffer circuit 200 through data lines, and may provide received data to the page buffer circuit 200 or output data provided from the page buffer circuit 200 to the outside.

The cell counter 700 may receive page buffer signals from the page buffer circuit 200. The cell counter 700 may also perform a counting operation based on the received page buffer signals. The cell counter 700 may provide count information CNT, indicating results of performing the count operation, to the control logic 500. The cell counter 700 may be implemented as a component separate from the control logic 500, and may also be implemented as a part of the control logic 500.

As used herein, an "operation section" may refer to a temporal sequence of one or more steps or functions in a process. For example, a data read operation section may indicate a temporal sequence in which a data read operation corresponding to a read operation is performed. According to the memory device 10 of an example embodiment, a data read operation section is performed. The data read operation section may include a dummy read operation section and a page read operation section. Details thereof will be more fully described with reference to FIG. 6. The memory device 10 may, in a first data read operation section, perform a first dummy read operation on the first memory cells connected to the first word line by using a dummy read voltage having an offset level of a first level. In the first data read operation section, the memory device 10 may also determine degradation of a threshold voltage distribution of the memory cells as the first dummy read operation is performed, and may store results of the determining the degradation of the threshold voltage distribution of the first memory cells.

Degradation may be, or may reflect, a difference between an actual threshold voltage distribution of memory cells and an expected threshold voltage distribution of the memory cells. The expected threshold voltage distribution may be set based on the class of a memory device, initial testing of the threshold voltage distribution for the memory device, or other mechanisms for setting an expected threshold voltage distribution. Mechanisms for determining the degradation are described herein, and include counting memory cells with threshold voltages in a range that is either predetermined or dynamically identified. Moreover, mechanisms for compensating for the degradation are described herein, and include adjusting an offset level used to adjust a read voltage (e.g., a dummy read voltage) based on the degradation and then applying the adjusted read voltage to a word line.

The offset level of the dummy read voltage may be a value obtained by compensating for the dummy read voltage from a reference voltage. The dummy read voltage may be a value obtained by adding the offset level of the dummy read voltage to a reference voltage. The memory device 10 may adjust the offset level of the dummy read voltage to be a second level based on the results of the determining the degradation of the threshold voltage distribution of the memory cells. In a second read operation section, the memory device 10 may perform a second dummy word operation on the second memory cells connected to the second word line by applying to the second word line the dummy read voltage having the offset level adjusted to be the second level. In the second read operation section the memory device 10 may also perform a second dummy word operation on the second memory cells connected to the second word line. A degradation degree of a threshold voltage distribution in a dummy read operation in a previous read operation section is determined and stored. An offset level of a dummy read voltage to be used for a dummy read operation in a next dummy read operation section is adjusted based on the stored degradation degree of the threshold voltage distribution. As a result of determining and storing the degradation degree from the previous read operation section and adjusting the offset level of the dummy read voltage for the next dummy read operation section, reliability of dummy read operations may be increased, and reliability of data read operations of the memory device 10 may also be increased.

Figure 2A:
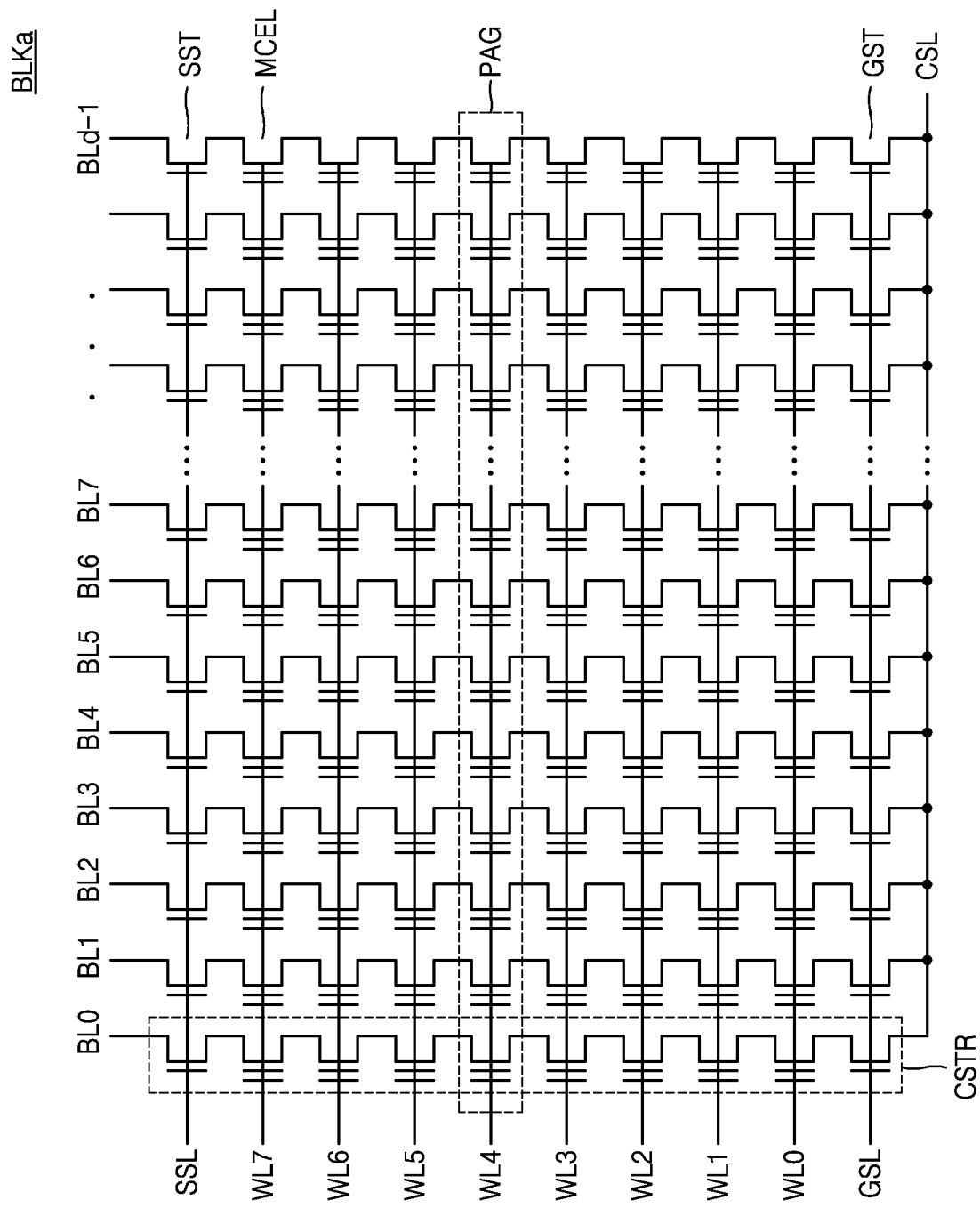
FIGS. 2A and 2B respectively illustrate a memory block according to an embodiment.
Figure 2B:
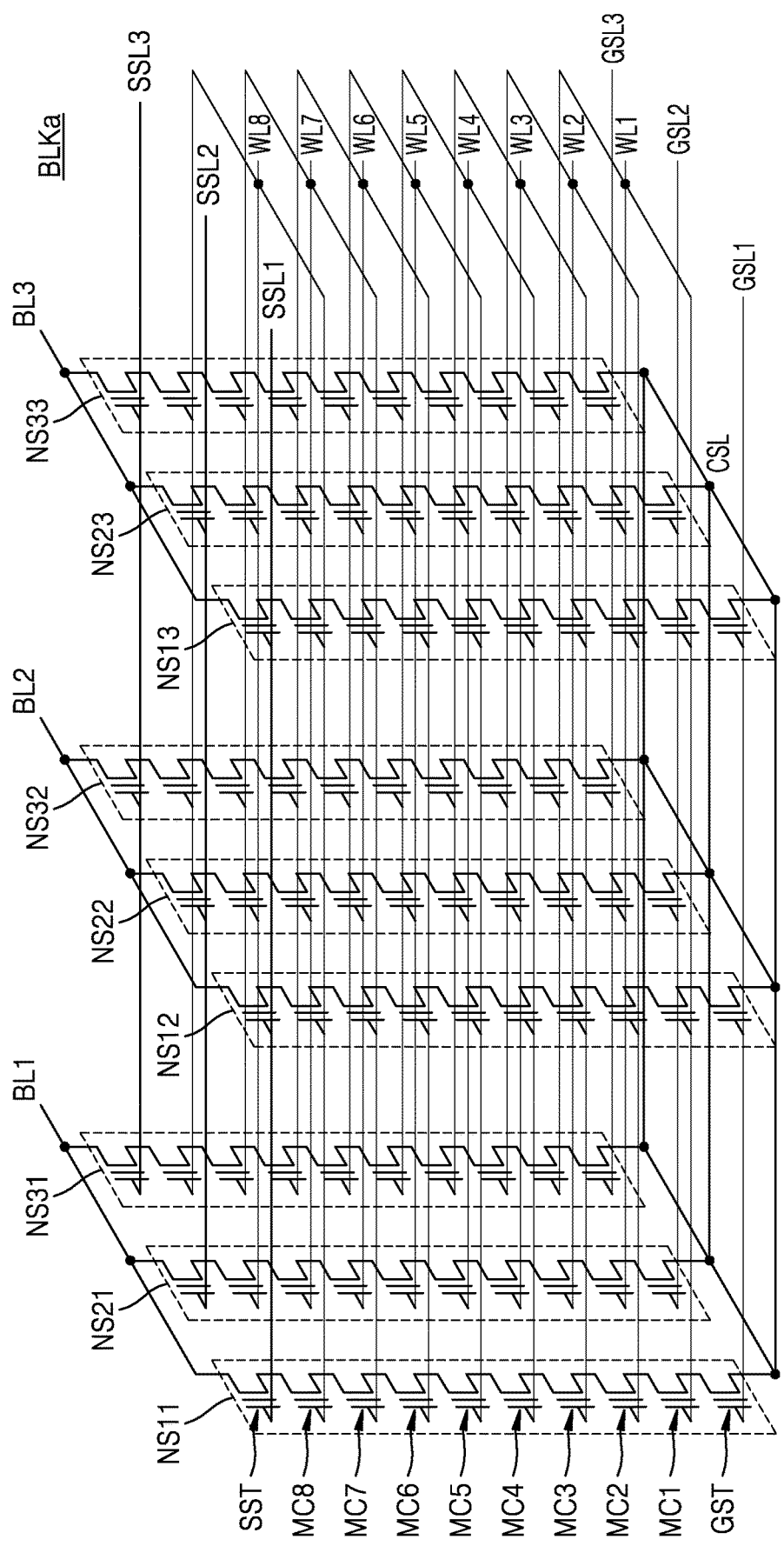

FIGS. 2A and 2B illustrate a memory block BLKa according to an example embodiment. Each of the memory blocks BLK1 through BLKz, included in the memory cell array 100 of FIG. 1, may be the memory block BLKa shown in FIG. 2A or FIG. 2B.

Referring to FIG. 2A, the memory block BLKa may, in a direction of the bit lines BL0 through BLd−1, include d (d is a natural number equal to or greater than 2) cell strings CSTRs respectively including eight memory cells MCELs that are serially connected. Each of the cell strings CSTRs may include a string selection transistor SST and a ground selection transistor GST respectively connected to two opposite ends of the serially connected memory cells. Also, the string selection transistors SSTs may be connected to a string selection line SSL, and the ground selection transistors GSTs may be connected to a ground selection line GSL.

A NAND flash memory device having a structure such as that shown in FIG. 2A may perform an erase operation in block units and perform a write operation in physical page PAG units corresponding to each of the word lines WL0 through WL7. FIG. 2A illustrates an example in which eight physical pages PAGs, with respect to the eight word lines WL0 through WL7, are arranged in each block. However, the number of memory cells and pages included in blocks of the memory cell array 100 according to example embodiments may be different from the number of memory cells MCELs and the number of the physical pages PAGs shown in FIG. 2.

Referring to FIG. 2B, the memory block BLKa may include multiple NAND strings NS11 through NS33, multiple ground selection lines GSL1 through GSL3, multiple string selection lines SS1 through SSL3, and a common source line CSL. Here, the numbers of NAND strings, word lines WLs, bit lines BLs, ground selection lines GSLs, and string selection lines SSLs may vary according to embodiments.

NAND strings NS11, NS21, and NS31 may be provided between a first bit line BL1 and the common source line CSL. NAND strings NS12, NS22, and NS32 may be provided between a second bit line BLs and the common source line CSL. NAND strings NS13, NS23, and NS33 may be provided between a third bit line BL3 and the common source line CSL. Each of the NAND strings (for example, NS11) may include a string selection transistor SST, multiple memory cells MC, and a ground selection transistor GST serially connected.

The string selection transistors SSTs may be connected to corresponding string selection lines SSL1 through SSL3. The memory cells MC may respectively be connected to corresponding word lines WL1 through WL8. The ground selection transistors GSTs may be connected to corresponding ground selection lines GSL1 through GSL3. The string selection transistors SSTs may be connected to corresponding bit lines BL1 through BL3, and the ground selection transistors GSTs may be connected to the common source line CSL.

In FIG. 2B, although each of the strings is illustrated as including one string selection transistor SST, the strings are not limited thereto, and each of the strings may include an upper string selection transistor and a lower string selection transistor which are serially connected. Also, in FIG. 2B, although each of the strings is illustrated as including one ground selection transistor GST, the strings are not limited thereto. Each of the strings may include an upper ground selection transistor and a lower ground selection transistor which are serially connected. In this case, the upper ground selection transistors may be connected to corresponding ground selection lines GSL1 through GSL3, and the lower ground selection transistors may, in common, be connected to a common ground selection line CSL.

Figure 3:
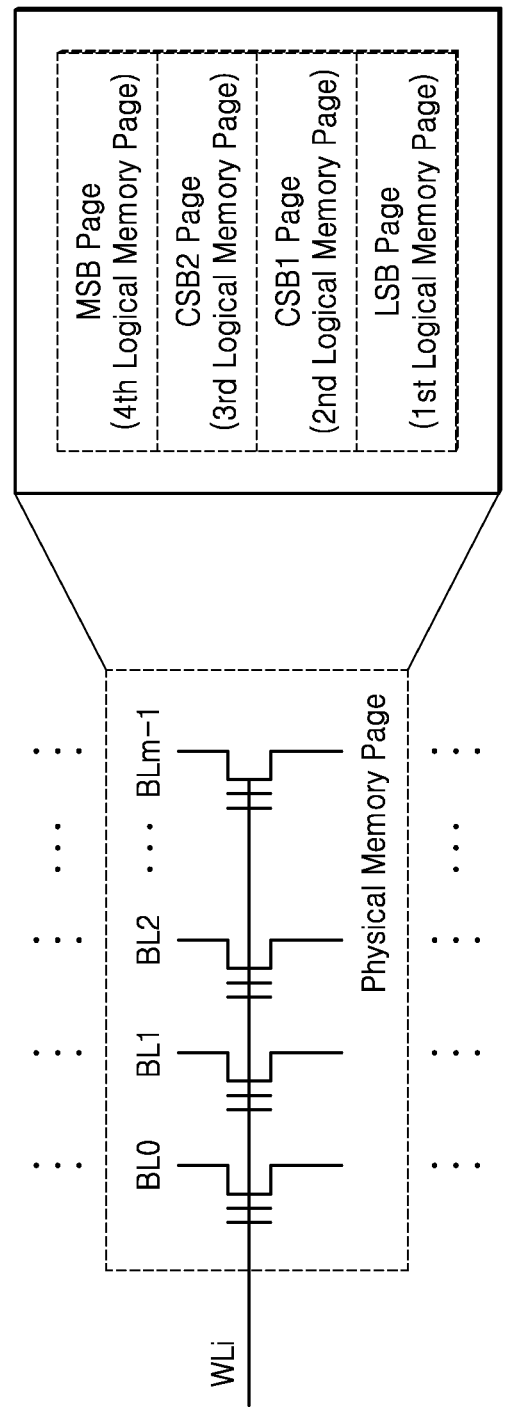
FIG. 3 illustrates a physical memory page according to an embodiment.

FIG. 3 illustrates the physical memory page according to an example embodiment. The physical memory page may include multiple memory cells connected to one (i.e., the same) word line WLi. Referring to FIG. 3, for example, the physical memory page may include memory cells arranged in an area in which a word line WLi and multiple bit lines BL0 through BLm−1 cross each other.

Each of the memory cells may be a cell storing data greater than 2-bit data. For example, when the memory cells included in the physical memory page are multi level cells respectively storing 2-bit data, each of the memory cells may store least significant bit (LSB) data and most significant bit (MSB) data. In this case, the physical memory page may include a first logical memory page and a second logical memory page logically classified into two pages. As another example, when the memory cells included in the physical memory page are triple level cells (TLCs) storing 3-bit data, each of the memory cells may include LSB bit data, central significant bit (CSB) data, and MSB data. In this case, the physical memory page may include a first logical memory page, a second logical memory page, and a third logical memory page, which are logically classified into three pages.

As a non-limited example, FIG. 3 illustrates a case in which the memory cells included in the physical memory page are QLCs respectively storing 4-bit data. In this case, each of the memory cells may store LSB data, first central significant (CSB1) data, second central significant (CSB2) data, and MSB data. The physical memory page may include a first logical memory page, a second logical memory page, a third logical memory page, and a fourth logical memory page which are logically classified into four pages. The first logical memory page may be an LSB page, the second logical memory page may be a CSB1 page, the third logical memory page may be a CSB2 page, and the fourth logical memory page may be an MSB page. In a data read operation, the logical memory pages may be distinguished by an address received from the memory controller. In other words, a read operation, corresponding to a command signal received from the memory controller, may be understood as a read operation on a logical memory page.

Figure 4:
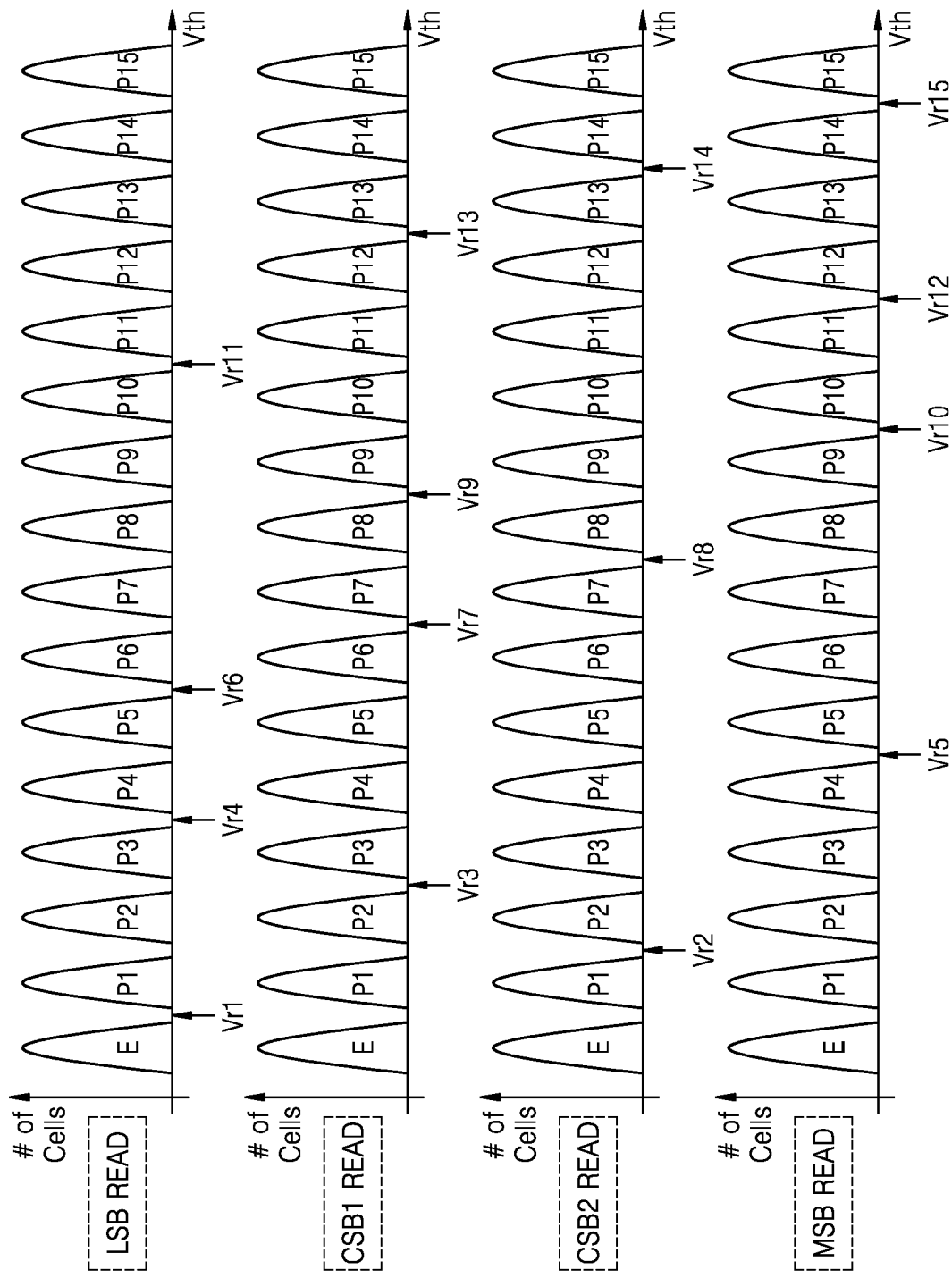
FIG. 4 illustrates threshold voltage distribution graphs of memory cells for describing read operations with respect to logical memory pages according to an example embodiment.

FIG. 4 illustrates threshold voltage distribution graphs of the memory cells for describing read operations on the logical memory pages according to an example embodiment. Although FIG. 4 illustrates threshold voltage distribution graphs of a case in which the memory cells are QLCs, descriptions of FIG. 4 may be similarly applied to memory cells storing different bits.

When each of the memory cells is a QLC, a state of each of the memory cells may be one of an erase state E and fifteen program states P1 through P15. Each of the memory cells connected to one (i.e., the same) word line may include an LSB page, a CSB1 page, a CSB2 page, and an MSB page. In read operations with respect to the logical memory pages, program states may be identified to be different from one another.

For example, in a read operation with respect to the LSB page, the memory device 10 may identify an eleventh program state P11 by applying an eleventh read voltage Vr11 to a word line. Additionally, the memory device may identify a sixth program state P6, a fourth program state P4, and a first program state P1 by applying a sixth read voltage Vr6, a fourth read voltage Vr4, and a first read voltage Vr1 each to the word line.

Likewise, in a read operation with respect to the CSB1 page, the memory device 10 may identify a thirteenth program state P13, a ninth program state P9, a seventh program P7, and a third program state P3 by applying a thirteenth read voltage Vr13, a ninth read voltage Vr9, a seventh read voltage Vr7, and a third read voltage Vr3 to the word line.

Likewise, in a read operation with respect to the CSB2 page, the memory device 10 may identify a fourteenth program state P14, an eighth program state P8, and a second program state P2 by applying a fourteenth read voltage Vr14, an eighth read voltage Vr8, and a second read voltage Vr2 each to the word line.

Likewise, in a read operation with respect to the MSB page, the memory device 10 may identify a fifteenth program state P15, a twelfth program state P12, a tenth program state P10, and a fifth program state P5 by applying a fifteenth read voltage Vr15, a twelfth read voltage Vr12, a tenth read voltage Vr10, and a fifth read voltage Vr5 each to the word line.

Figure 5:
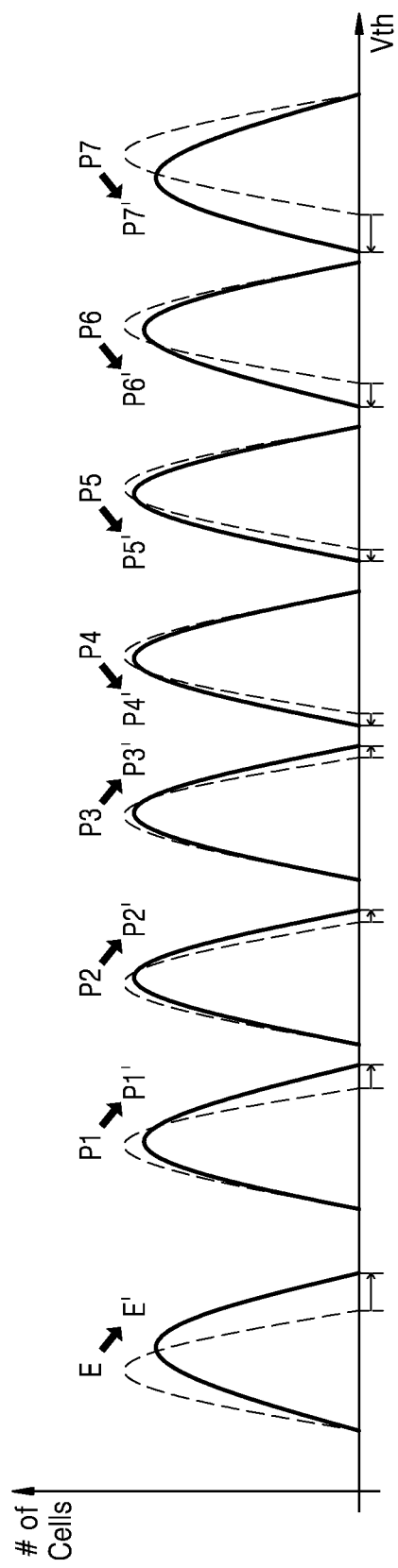
FIG. 5 illustrates a threshold voltage distribution graph of memory cells for describing change in a threshold voltage distribution according to an example embodiment.

FIG. 5 illustrates a threshold voltage distribution graph of the memory cells for describing change in a threshold voltage distribution according to an example embodiment. For convenience of explanation, FIG. 5 illustrates a case in which the memory cells are TLCs, but the embodiment is not limited thereto.

Each of the memory cells may be in one of an erase state E and a first program state P1 through a seventh program P7. A threshold voltage distribution of the erase state E and, the first program state P1 through the seventh program state P7 may have an ideal form.

An ideal threshold voltage distribution of the erase state E and the program states may vary according to various environmental factors. As non-limited examples, the environmental factors may include a retention time, read disturb, or temperature bumps, and so on. The retention time, which is a period of time passed at a high temperature or room temperature after performance of programming operations on the memory cells, may also be referred to as a data retention time. The read disturb indicates degradation of a threshold voltage distribution of the memory cells connected to word lines, which are adjacent to a selected word line, due to repeated performances of the read operations on memory cells connected to the selected word line. Adjacent word lines may be adjacent by virtue of being next to one another with no other word lines placed therebetween. The temperature bump indicates degradation of the threshold voltage distribution of the memory cells due to performances of high temperature programming/high temperature reading, high temperature programming/low temperature reading, low temperature programming/low temperature reading, and low temperature programming/high temperature reading. Due to the various environmental factors mentioned above, the threshold voltage distribution may be degraded: for example, the erase state E may be degraded to a deviated erase state E', and the first program state P1 through the seventh program state P7 may respectively be degraded to a deviated first program state P1' through a deviated seventh program state P7'. Amounts of change in the threshold voltage distributions may vary according to program states. For example, a variation from the erase state E to the deviated erase state E' may have a positive value, and a variation from the seventh program state P7 to the deviated seventh program P7' may have a negative value. In this case, variation in the threshold voltage distribution may increase in the program states of higher levels. Patterns of changes in the threshold voltage distributions are not limited to the embodiment shown in FIG. 7. For example, the variation from the erase state E to the deviated erase state E' may have a positive value, and variations from the first through seventh program states P1 through P7 to the deviated first through seventh program states P1' through P7' may have negative values.

As shown in FIG. 5, the threshold voltage distribution of the memory cells may be degraded due to various environmental factors. When a variation in the threshold voltage distribution is great, errors may be caused during read operations. The memory device 10 according to example embodiments may, to reduce errors in read operations due to variations of the threshold voltage distributions, perform dummy read operations in read operation sections. Performances of the dummy read operations will be described with reference to FIG. 6.

Figure 6:
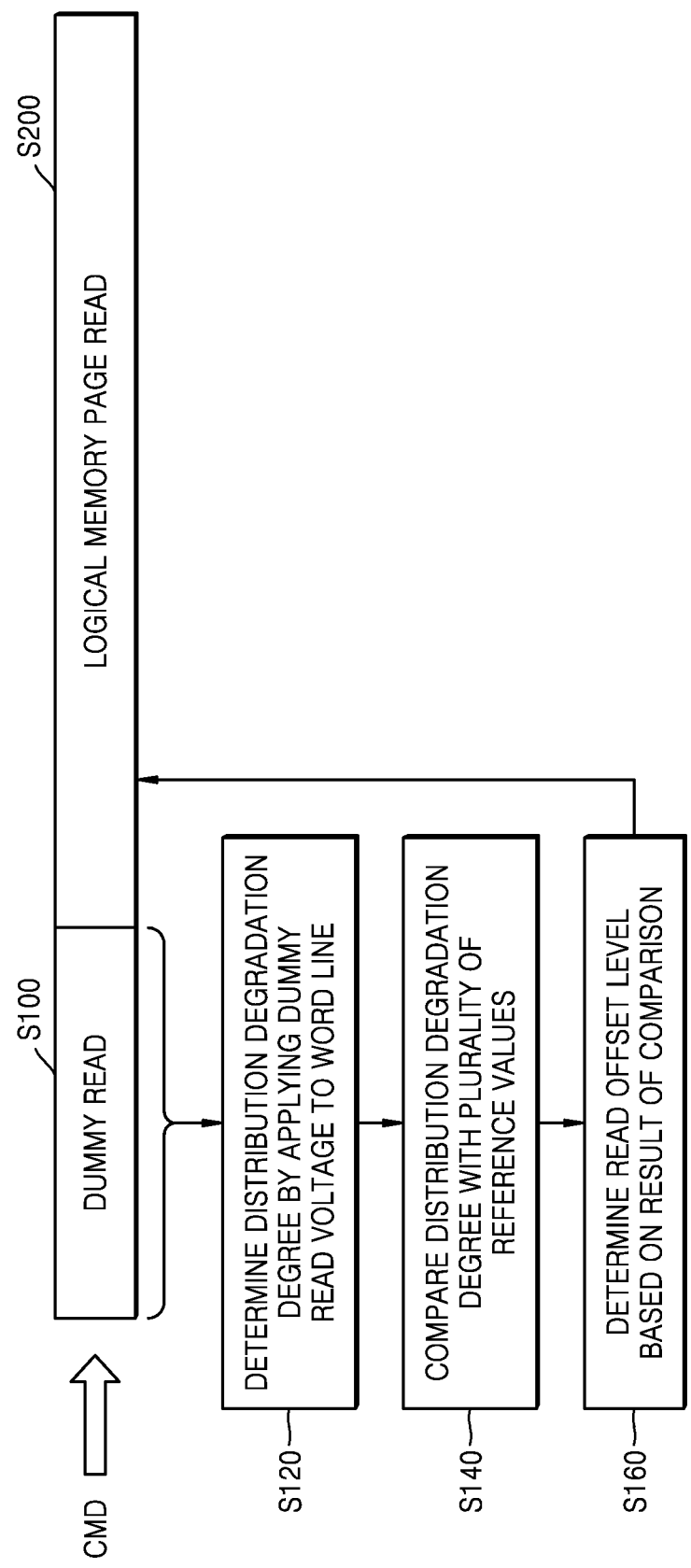
FIG. 6 illustrates a flowchart of a data read operation corresponding to a read command according to an example embodiment.

FIG. 6 illustrates a flowchart of a data read operation corresponding to a read command CMD according to an example embodiment. FIG. 6 is described with reference to FIG. 1.

When a read command CMD is received from the memory controller at the outside of the memory device 10, the memory device 10 may perform a dummy read operation (S100). The read command CMD may be a read command signal corresponding to a second read operation. The read command signal may include an adjusted offset level, such that the memory controller transmits the adjusted offset level with the read command signal corresponding to the second read operation. The dummy read operation may be a previous operation for compensating for a read voltage, when the threshold voltage distribution of the memory cells in the physical memory page including selected memory cells is degraded. Accordingly, after the dummy read operation, the memory device 10 may perform a read operation on a logical memory page corresponding to the address ADDR received together with the read command CMD.

The dummy read operation will now be described in more detail. The memory device 10 may determine a threshold voltage distribution degradation degree of the memory cells by applying a dummy read voltage to selected word lines (S120). The memory device 10 may, during the dummy read operation, use one of the program states P1 through P15 described with reference to FIG. 4. For example, the memory device 10 may, during performance of the dummy read operation, use the fifteenth program state P15, and in this case, the dummy read voltage may be the fifteenth read voltage Vr15. However, the embodiment is not limited thereto. For example, the memory device 10 may, during the dummy read operation, use the fourteenth program state P14, and in this case, the dummy read voltage may be the fourteenth read voltage Vr14. In an embodiment, the memory device 10 may, after applying the dummy read voltage to the selected word lines, determine a distribution degradation degree by performing a cell counting operation corresponding to the dummy read operation. For example, the cell counter 700 of the memory device 10 may, after the dummy read voltage is applied to the selected word lines, perform the cell counting operation by counting the number of cells which are turned off. As another example, as described in FIG. 7, the memory device 10 may perform the cell counting operation by counting the number of cells among multiple voltages in the threshold voltage distribution through multiple sensing operations.

That is, a dummy read operation may include performing multiple sensing operations by applying multiple word line voltages to a word line, where each word line voltage has a voltage gap. A cell counting operation may include counting a number of memory cells having threshold voltages between the word line voltages on the threshold voltage distribution.

The memory device 10 may compare the determined threshold distribution voltage degradation degree to multiple reference values (S140).

The memory device 10 may determine a read offset level based on a result of comparing the determined threshold voltage distribution degradation degree to the reference values (S160). The read offset level is an offset level compensating for read voltages used for read operations with respect to the logical memory pages. For example, when the threshold voltage distribution degradation degree is less than a first reference value, the memory device 10 may determine the read offset level as '0'. As another example, when the threshold voltage distribution degradation degree is equal to or greater than the first reference value and less than a second reference value, the memory device 10 may determine the read offset level as a first read offset level.

The memory device 10 may perform the read operations on the logical memory pages by using the determined read offset level. Likewise, in the read operation section, by compensating for the read voltage by performing the read operation before the operations with respect to the logical memory pages, reliability of the read operations of the memory device 10 may be improved.

Figure 7:
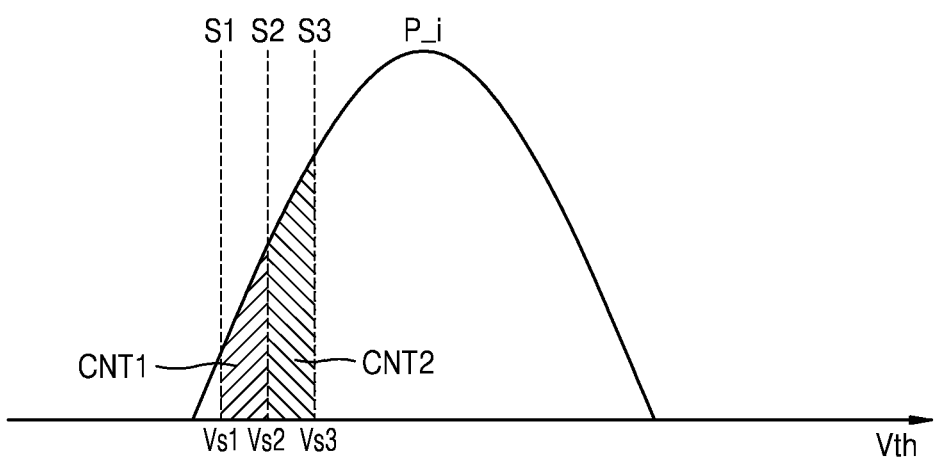
FIG. 7 illustrates a part of the threshold voltage distribution graph of memory cells for describing a case of performing a dummy read operation by using an $i^{th}$ program state according to an example embodiment.

FIG. 7 illustrates a part of the threshold voltage distribution graph of the memory cells for describing a case of performing a dummy read operation by using an $i^{th}$ program state P_i according to an example embodiment. In other words, FIG. 7 illustrates a case of the $i^{th}$ program state P_i used for the dummy read operation. Although FIG. 7 illustrates a case in which the dummy read operation is performed by using three sensing voltages, the number of sensing voltages to be applied is not limited thereto. For example, the memory device 10 may perform the dummy read operation by applying two sensing voltages to a word line. FIG. 7 is described with reference to FIG. 1.

The memory device 10 may, in the dummy read operation, perform multiple sensing operations to determine threshold voltage distribution degradation degrees of the memory cells connected to selected word lines. After a first sensing voltage Vs1 is applied to the selected word lines, the page buffers included in the page buffer circuit 200 may store data of the memory cells, detected through the bit lines BL, in a first latch. Likewise, when a second sensing voltage Vs2 and a third sensing voltage Vs3 are respectively applied to the selected word lines, the page buffers included in the page buffer circuit 200 may store data of the memory cells, detected through the bit lines BLs, to a second latch and a third latch. By performing exclusive OR (XOR) operations on the data stored in the first latch and the second latch, the cell counter 700 may count the number of memory cells, having threshold voltages between the first sensing voltage Vs1 and the second sensing voltage Vs2, as first count information CNT1. Therefore, the number of memory cells having threshold voltages between word line voltages in a threshold voltage distribution can be counted by the cell counter 700, and provided to the control logic 500. Likewise, the cell counter 700 may count the number of memory cells having threshold voltages between the second sensing voltage Vs2 and the third sensing voltage Vs3 as second count information CNT2, by performing exclusive OR operations on data stored in the second latch and the third latch. The cell counter 700 may provide the first count data CNT1 and the second count data CNT2 to the control logic 500.

The control logic 500 may determine distribution degradation degree of the threshold voltages of the memory cells based on the first count information CNT1 and the second count information CNT2. For example, in a left area of the threshold voltage distribution, as the first count information CNT1 and the second count information CNT2 indicate greater values, the degradation degree of the threshold voltages may be determined to be higher. In addition, in a right area of the threshold voltage distribution, as the first count information CNT1 and the second count information CNT2 indicate smaller values, the degradation degree of the threshold voltages may be determined to be higher.

As described above, by applying the sensing voltages to the selection word lines, the number of memory cells having threshold voltages among the sensing voltages may be counted, and the distribution degradation degree of the threshold voltages may be determined by using count information. However, in an embodiment according to another aspect, even though the sensing voltage is applied once to the selection word lines, by performing multiple sensing operations and latching operations, the time required for an additional bit line precharge may be reduced. Bit line precharge is a precharge performed with respect to bit lines of a memory device. An embodiment thereof will be described with reference to FIG. 8B.

Figure 8A:
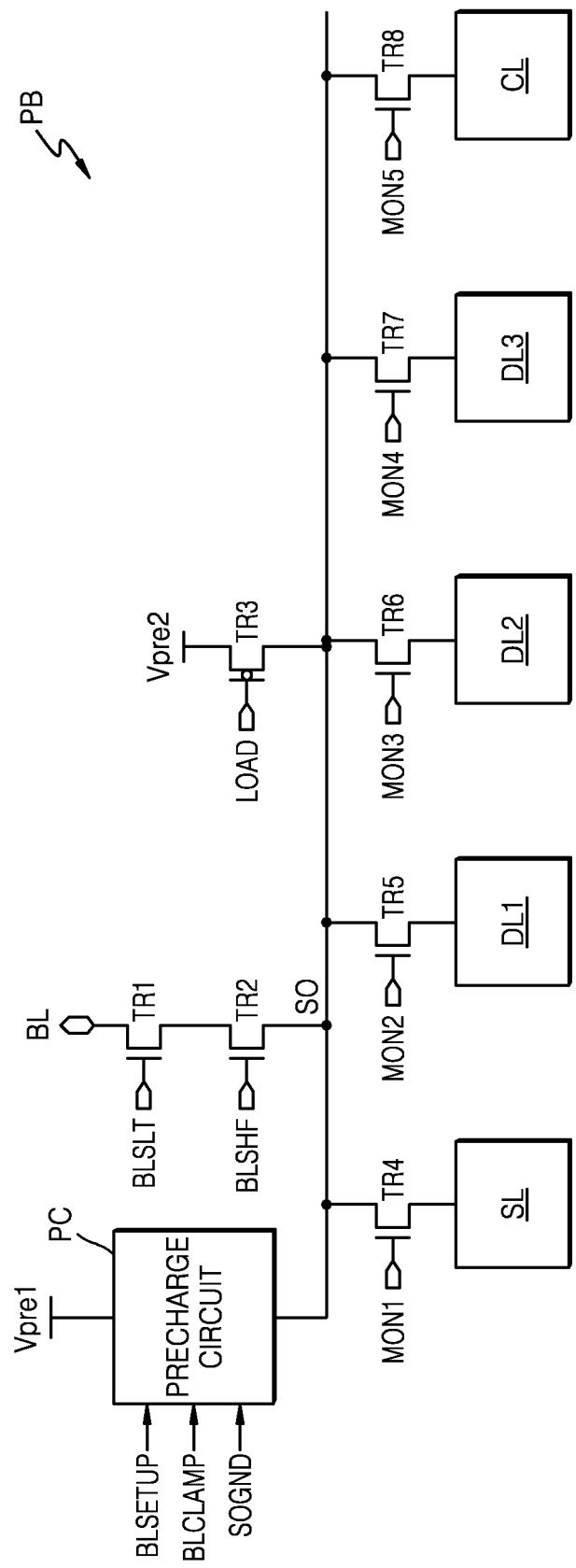
FIG. 8A is a circuit diagram illustrating a page buffer according to an embodiment.

FIG. 8A is a circuit diagram illustrating a page buffer PB according to an example embodiment.

Referring to FIG. 8A, the page buffer PB may correspond to one of the page buffers included in the page buffer circuit 200. The page buffer PB may include a precharge circuit PC, a sensing latch SL, first through third data latches DL1 through DL3, and a cache latch CL, which are respectively connected to a senseout node SO. The number of the first through third data latches D1 through D3 may vary according to data bit stored in the memory cells. The page buffer PB may further include a bit line selection transistor TR1, a bit line voltage control transistor TR2, a precharge transistor TR3, and monitoring transistors TR4 through TR8.

According to the detected data stored in the sensing latch SL, a first data latch DL1 in which target data is stored may be set. The cache latch CL may temporarily store input data provided from outside. During a programming operation, target data stored in the cache latch CL may be stored in the first through third data latches DL1 through DL3.

Figure 8B:
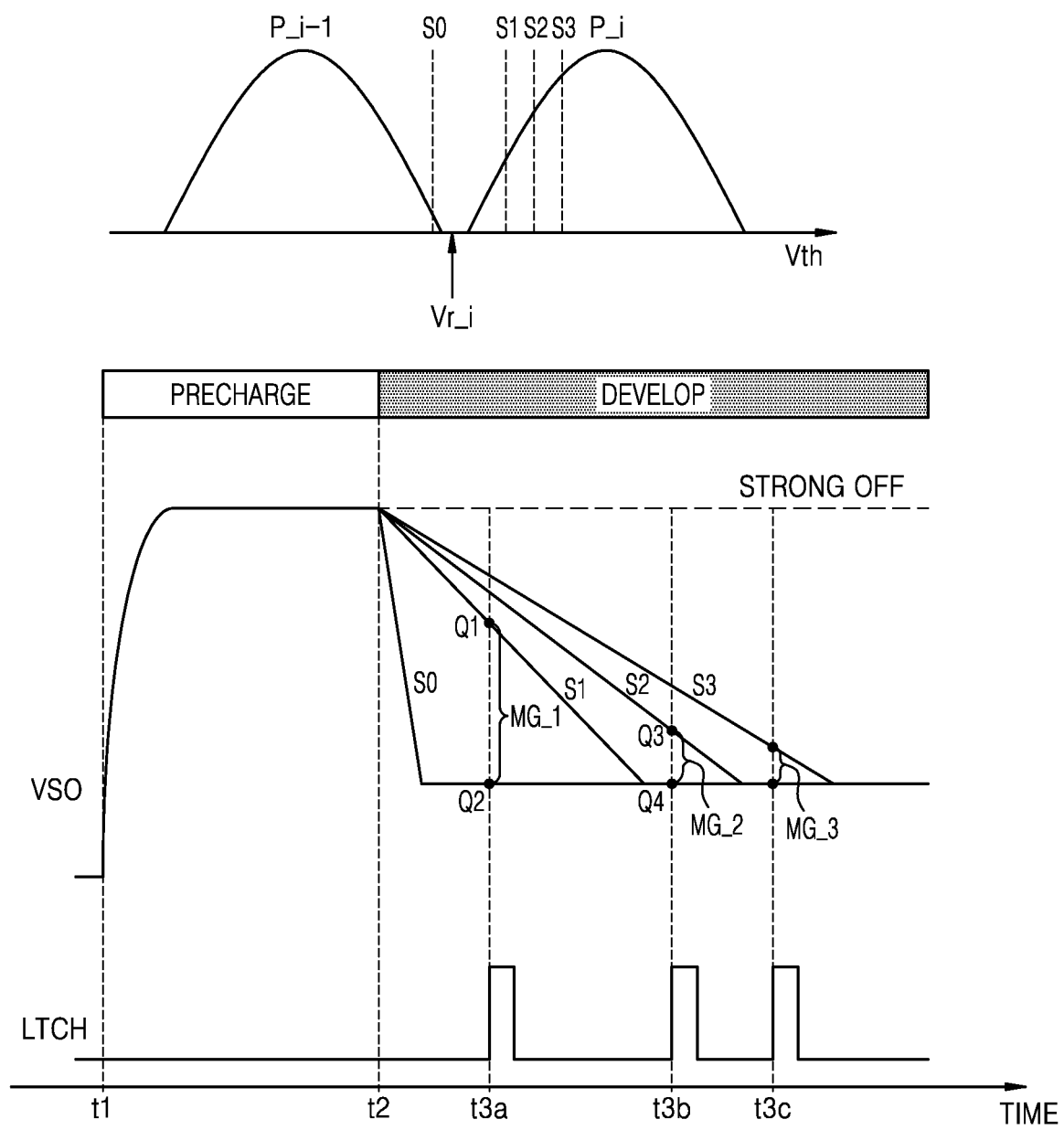
FIG. 8B illustrates a part of the threshold distribution graph of the memory cells and a timing chart for describing the dummy read operation according to an example embodiment.

FIG. 8B illustrates a part of the threshold distribution graph of the memory cells and a timing chart for describing the dummy read operation according to an example embodiment. FIG. 8B is described with reference to FIG. 1.

A dummy read operation section may include a precharge section and a develop section. A latch operation may be performed in the develop section. As described below, a dummy read operation may include performing multiple sensing operations by using different develop time periods of a senseout node of a page buffer.

In the precharge section t1 through t2, a senseout node voltage VSO may be precharged. At t2 point, the precharge section may end and the develop section may begin.

In the develop section (from t2), as paths leading to a senseout node, bit lines, and the memory cell array are formed, the senseout node voltage VSO may vary according to conditions of the connected memory cells. Assuming that an $i^{th}$ read voltage Vr_i is applied to the selection word line, a graph of the develop section is shown.

Even when the memory cell is a memory cell on an S0 line of the threshold voltage distribution graph of FIG. 8B, as a threshold voltage of the memory cell is lower than the $i^{th}$ read voltage Vr_i applied to the word line, the selected memory cell may be a relatively strong on cell. As the memory cell is the strong on cell located on the S0 line, a channel path may be formed in the memory cell, and as the precharged electric charge is discharged through the formed channel path, the senseout node voltage VSO may promptly reach to a lower value.

On the other hand, when the memory cell is a memory cell having a threshold voltage higher than an S3 line, the memory cell may be a strong off cell. As the memory cell is the strong off cell, a channel path may not be formed in the memory cell, and as the precharged electric charge is not discharged, the amount of change of the senseout node voltage VSO may be insignificant.

When the memory cell is on an S1 line shown in FIG. 8, although a threshold voltage of the memory cell is higher than the applied voltage of the word line, as a gap between the threshold voltage of the memory cell and the applied voltage of the word line is not great, the senseout node voltage VSO may decrease more gradually than in on the SO line and reach a target value.

As the memory cell goes from S2 line to S3 line of FIG. 8B, a threshold voltage of the selection memory cell becomes higher than the applied voltage of the word line, and a slope in which the senseout node voltage VSO may gradually become gentle.

At t3a point, when sensing is performed in response to a sensing latch signal LTCH, according to whether a memory cell is on the S0 line or the S1 line, the senseout node voltage VSO may be at a Q2 point or Q1 point. Accordingly, by using a first sensing margin MG_1, a memory cell in the SO line and a memory cell in the S1 line may be distinguished.

Likewise, at t3b point, when sensing is performed in response to the sensing latch signal LTCH, according to whether a memory cell is on S1 line or S2 line, the senseout node voltage may be at Q4 point or Q3 point. Accordingly, by using a second sensing margin MG_2, a memory cell in the S1 line and a memory cell in the S2 line may be distinguished.

Likewise, at t3c point, when sensing is performed by a sensing latch signal LTCH, according to whether the memory cell is in the S2 line or the S3 line, the senseout node voltage VSO may be at the Q6 point or the Q5 point. Accordingly, by using a third sensing margin MG_3, a memory cell in the S2 line and a memory cell in the S3 line may be distinguished.

As described above, when changing the develop time of the senseout node while developing the senseout node several times after precharging once and applying a word line voltage once, it is possible to obtain the same effect as consecutively applying multiple voltages to the word lines, as shown in FIG. 7. In this case, as time consumed for bit line precharge may be reduced, time consumption may significantly decrease. However, the develop time of the senseout node may be changed only in a certain time unit. A time unit that may be used for changing the develop time may be referred to as a develop time period variable unit, and the different develop times are different develop time periods. When an effect of changing the develop time of the senseout node by the develop time period variable unit is the same as an effect of changing a voltage applied to the word line by a first voltage gap, the first voltage gap may be referred to as a valid word line voltage variable unit. In other words, when changing the develop time of the senseout node by the develop time period variable unit, it is possible to obtain the same effect as changing the word line voltage by the first voltage gap. The first voltage gap thus indicates a valid word line voltage variable unit, and they correspond to the develop time period variable unit. In this case, the valid word line voltage variable unit is a first voltage gap that may be greater than a second voltage gap. The second voltage gap has a size of a second voltage gap unit, and is smaller than a size of a first voltage gap. The second voltage gap is a word line voltage variable unit indicating a unit in which an actual word line voltage may be changed. The memory device 10 according to an example embodiment may adjust the dummy read voltage applied to the word lines at an initiatory stage in word line voltage variable units, to more elaborately perform the dummy read operation when performing the dummy read operation according to FIG. 8B.

Figure 9:
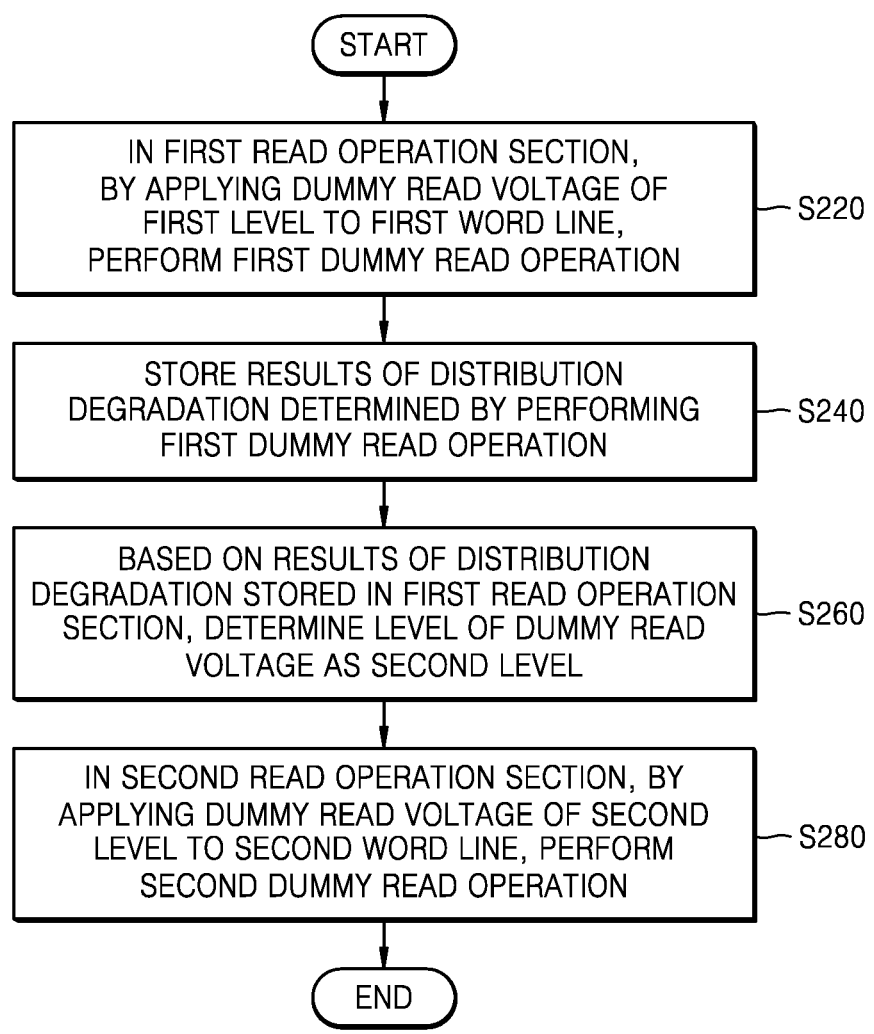
FIG. 9 is a flowchart illustrating a method of operating the memory device, according to an example embodiment.

As set forth above, a dummy read operation may include performing sensing operations multiple times by using different develop time periods. The offset level can be adjusted by determining the second level (second offset level) in a second voltage gap unit smaller than a first voltage gap FIG. 9 is a flowchart illustrating a method of operating the memory device 10, according to an example embodiment. FIG. 9 is described with reference to FIG. 1.

In the first read operation section, the memory device 10 may perform a first dummy read operation (S220) by applying a dummy read voltage having an offset level of a first level to a first word line. The first read operation, which a read operation with respect to selection memory cells connected to the first word line, may include a first dummy read operation and read operations with respect to logical memory pages.

The memory device 10 may determine degradation of the threshold voltage distribution of the first memory cells connected to the first word line by performing the first dummy read operation, and store results of determination of the threshold voltage distribution degradation as a store result. In an embodiment, the cell counter 700 may perform a first cell counting operation corresponding to the first dummy read operation. The control logic 500 may determine distribution degradation of the threshold voltages of the first memory cells based on count information indicating a result of performing the first cell counting operation by the cell counter 700. Also, in an embodiment, the memory device 10 may store degradation degree of the threshold voltage distribution as a result of determination on distribution degradation of the threshold voltages.

In FIG. 9, the control logic 500 may be a control logic circuit. The control logic circuit is configured to determine degradation of the threshold voltage distribution of the first memory cells, based on count information received from the cell counter 700. The control logic 500 is also configured to store a result of determining degradation of the threshold voltage distribution as a store result of determining degradation. An offset level of a dummy read voltage used for a second dummy operation is adjusted in a second read operation based on the store result. The second read operation may be an act among one or more acts in a second read operation section, and is performed with respect to second memory cells connected to a second word line. Thus, the result of determining degradation of the threshold voltage distribution of first memory cells is used as the basis for adjusting to a second offset level used in a second read operation section with respect to second memory cells.

The memory device 10 may determine an offset level of the dummy read voltage as a second level, based on a result of determining distribution degradation stored in the first read operation section (S260). In an embodiment, the control logic 500 may determine an offset level of a dummy read voltage as a second level by comparing degradation degree of the threshold voltages of the first memory cells to the offset level compensation table. That is, the degradation degree of the threshold voltages of the first memory cells may be compared to a value or multiple values in an offset level compensation table. In an embodiment, the control logic may, based on adjacency between the first memory cells and the second memory cells, select an offset level compensation table from offset level compensation criterion information stored in the memory device 10. That is, an offset level compensation table may be selected based on criterion information specific to offset level compensation and stored in the memory device 10.

In the second read operation section, the memory device 10 may perform a second dummy read operation on the second memory cells connected to the second word line, by applying a dummy read voltage having an offset level of a second level to a second word line (S280). In an embodiment, the first word line and the second word line may be the same word line. In another embodiment, the second read operation may be an initial read operation after the first read operation. That is, the second read operation may be performed after the first read operation with no other read operation being performed between the second read operation and the first read operation. In another embodiment, the second memory cells may be connected to a second string selection line adjacent to the first string selection line to which the first memory cells are connected. That is, the second string selection line may be physically next to the first string selection line with no other string selection line physically therebetween.

Reliability of a dummy read operation may be improved, and reliability in read operations of the memory device 10 may be improved by using the memory device 10 according to an example embodiment. The reliability is improved by determining and storing distribution degradation degree in a dummy read operation in a previous operation section, and by changing, based on the distribution degradation degree, a dummy read voltage used in a dummy read operation in a next read operation section.

Figure 10:
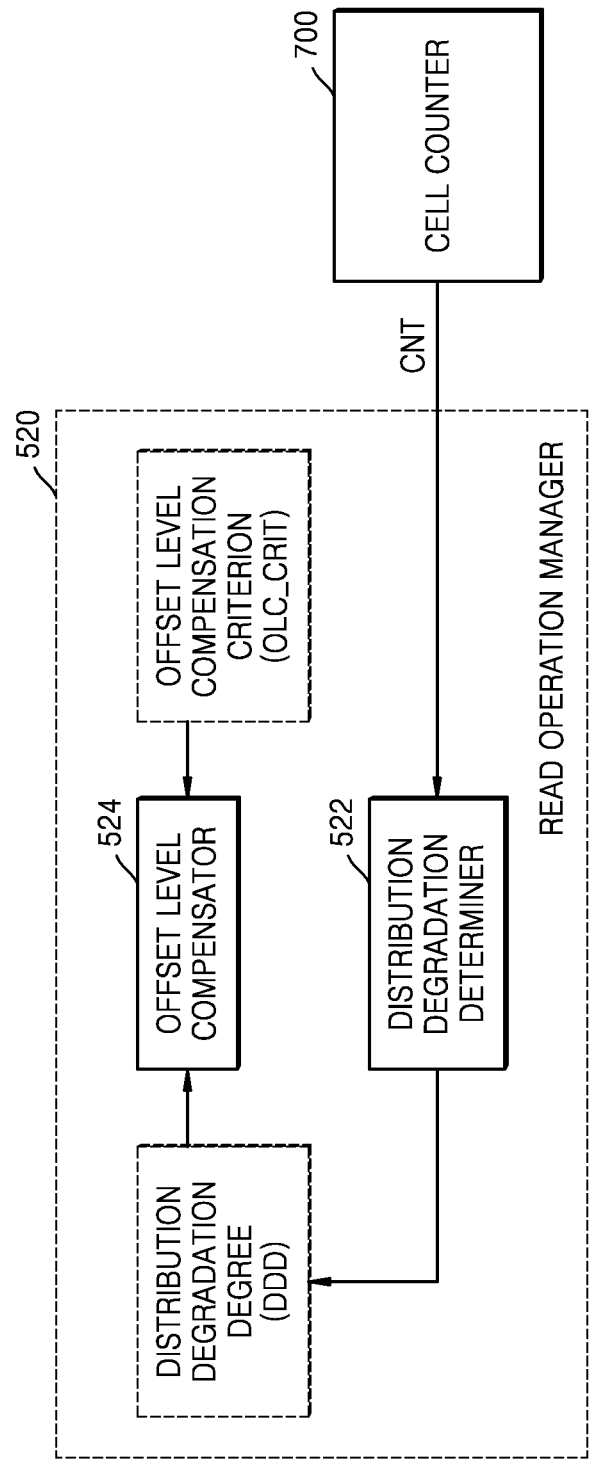
FIG. 10 illustrates a read operation manager and a cell counter according to an example embodiment.

FIG. 10 illustrates the read operation manager 520 and the cell counter 700 according to an example embodiment. The read operation manager 520 may include a distribution degradation determiner 522 and the offset level compensator 524.

The distribution degradation determiner 522 may receive count information CNT from the cell counter 700. For example, the distribution degradation determiner 522 may receive the first count information CNT1 and the second count information CNT2 of FIG. 7 as the count information CNT. The distribution degradation determiner 522 may determine distribution degradation degree DDD based on the received count information. The determined distribution degradation degree DDD may be stored in the control logic 500 of the memory device 10.

The offset level compensator 524 may adjust an offset level of the dummy read voltage, based on the threshold voltage distribution degradation degree DDD and the offset level compensation criterion OLC_CRIT stored in the control logic 500 of the memory device. In this case, the offset level compensator 524 may, in a word line voltage variable unit, adjust the offset level of the dummy read voltage.

Each of the read operation manager 520, the distribution degradation determiner 522, and the offset level compensator 524 may be implemented as hardware including circuits, and so on, and may also be implemented as software including multiple programs. However, the implementation is not limited thereto, and for example, each of the read operation manager 520, the distribution degradation determiner 522, and the offset level compensator 524 may be implemented as combinations of hardware and software.

Figure 11:
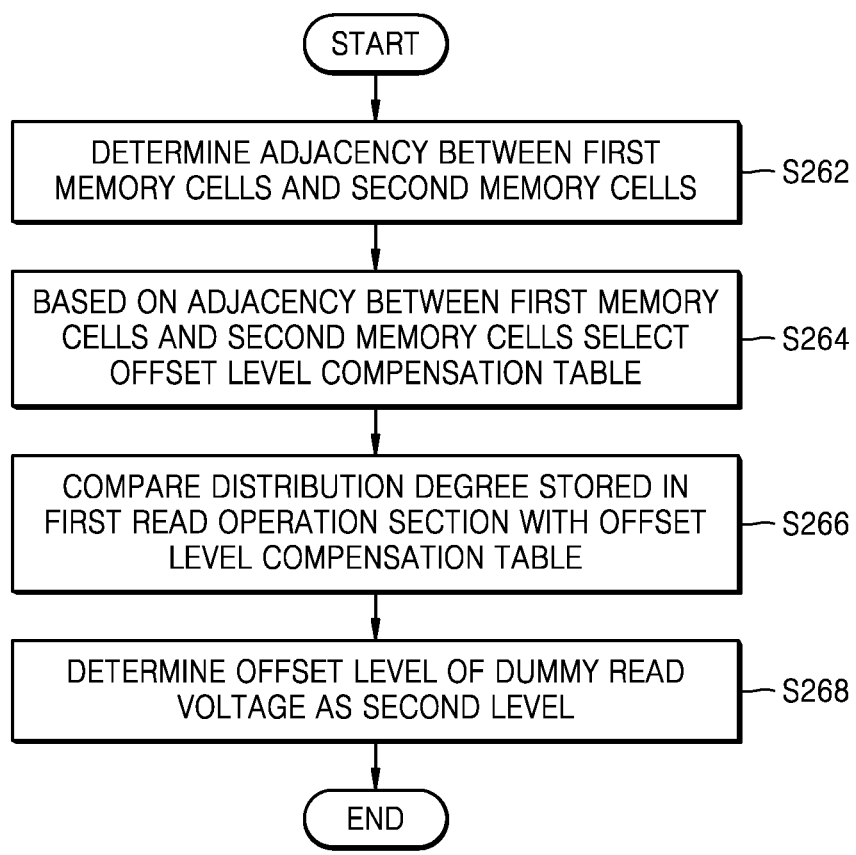
FIG. 11 is a flowchart illustrating a method of adjusting offset levels of a dummy read voltage, according to an example embodiment.

FIG. 11 is a flowchart illustrating a method of adjusting offset levels of the dummy read voltage according to an example embodiment. FIG. 11 may be a flowchart for more detailed description of the operation S260 of FIG. 9. FIG. 11 is described with reference to FIG. 1.

The memory device 10 may determine adjacency between the first memory cells connected to the first word line and the second memory cells connected to the second word line (S262). For example, the memory device 10 may determine whether the first word line is identical to the second word line, or whether the first word line and the second word line are word lines adjacent to one another. Also, for example, the memory device 10 may determine whether the first string selection line, connected to the first memory cells, and the second string selection line, connected to the second memory cells, are identical or adjacent to one another.

The memory device 10 may, based on the determined adjacency between the first memory cells and the second memory cells, select an offset level compensation table among the offset level compensation criterion OLC_CRIT (S264). In an embodiment, the offset level compensation criterion OCL_CRIT may include multiple offset level compensation tables corresponding to adjacency. The memory device 10 may, based on the determined adjacency, select an offset level compensation table among multiple offset level compensation tables.

The memory device 10 may compare the distribution degradation degree DDD, stored in the first read operation section, with the selected offset level compensation table (S266). That is, the memory device 10 may compare the distribution degradation degree DDD with a value or multiple values in the selected offset level compensation table at S266. In an embodiment, the offset level compensation table may include offset level compensation values corresponding to the distribution degradation degree DDD.

An offset level compensation value is a result of comparing the stored distribution degradation degree to an offset level compensation table. The memory device 10 may determine an offset level of a dummy read voltage to be used in the second read operation section as a second level, by using the offset level compensation value (S268).

FIG. 12 illustrates the offset level compensation criterion OLC_CRIT according to an example embodiment. As described in FIG. 10, the offset level compensation criterion OLC_CRIT may be stored in the control logic 500 of the memory device 10. The offset level compensation OLC_CRIT may include offset level compensation tables corresponding to the adjacency between the first memory cells and the second memory cells. FIG. 12 is described with reference to FIG. 1.

Referring to the operation S264 shown in FIG. 11, the memory device 10 may select an offset level compensation table OLC_TABLE, by comparing the adjacency between the first memory cells and the second memory cells with the offset level compensation criterion OLC_CRIT. For example, when the first word line connected to the first memory cells and the second word line connected to the second memory cells are the same, the memory device 10 may select a first offset level table OLC_TABLE_1. As another example, when the first string selection line connected to the first memory cells and the second string selection line connected to the second memory cells are adjacent to one another, the memory device 10 may select a third offset level table OLC_TABLE_3. A case in which a second offset level table OLC_TABLE_2 is selected and a case in which a fourth offset level table OLC_TABLE_4 is selected may be understood in the same manner as the cases described above.

The memory device 10 may, as described above, differently apply criterion for compensating the offset level of the dummy read voltage, according to relationships of physical locations of the first memory cells and the second memory cells.

FIG. 13A through 13D describe a part of the memory cell array 100 according to example embodiments. Referring together to FIG. 9, FIGS. 13A through 13D respectively illustrate embodiments according to relationships of a first memory page, on which the first read operation is to be performed, and a second memory page.

Figure 13A:
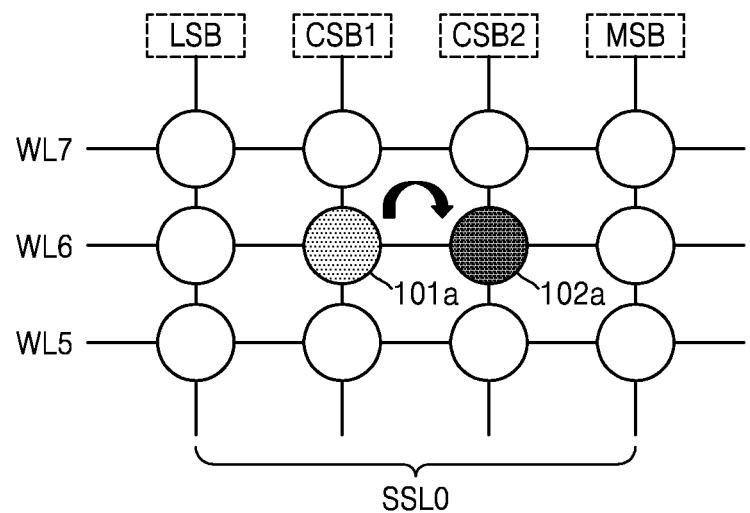
FIGS. 13A through 13D respectively illustrate parts of the memory cell array according to example embodiments.

FIG. 13A illustrates a case in which the first memory page 101a and the second memory page 102a are connected to one (i.e., the same) word line and have different logical memory pages. In this case, the first read operation and the second read operation may be sequentially performed. That is, in this case, the second read operation may be an initial read operation after the first read operation. In other words, the second read operation may be performed after the first read operation, with no other read operation being performed between the second read operation and the first read operation. In this case, besides physical adjacency, temporal adjacency may also be admitted. In this case, referring together to FIG. 12, the memory device 10 may select the offset level compensation table OLC_TABLE as the first offset level compensation table OLC_TABLE_1.

Figure 13B:
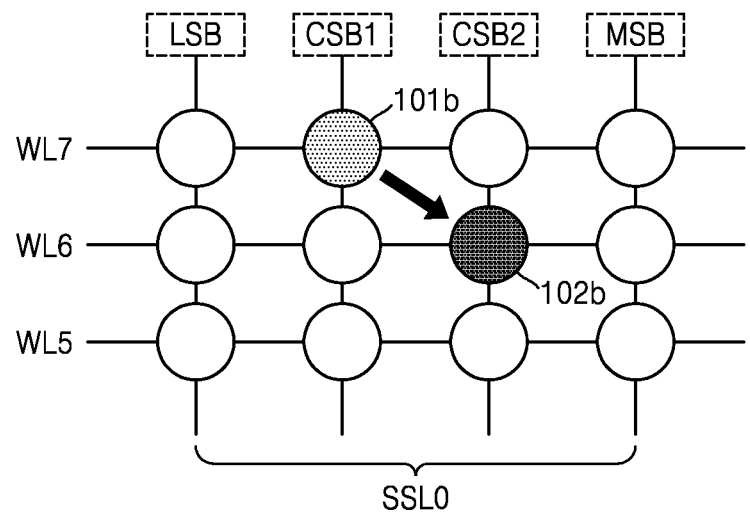

FIG. 13B illustrates a case in which the first memory page 101b and the second memory page 102b are respectively connected to two word lines adjacent to one another. That is, in FIG. 13B, the first memory page 101b and the second memory 102b may be physically next to one another with no other memory page intervening therebetween. In this case, referring together to FIG. 12, the memory device 10 may select the offset level compensation table OLC_TABLE as the second offset level compensation table OLC_TABLE_2.

Figure 13C:
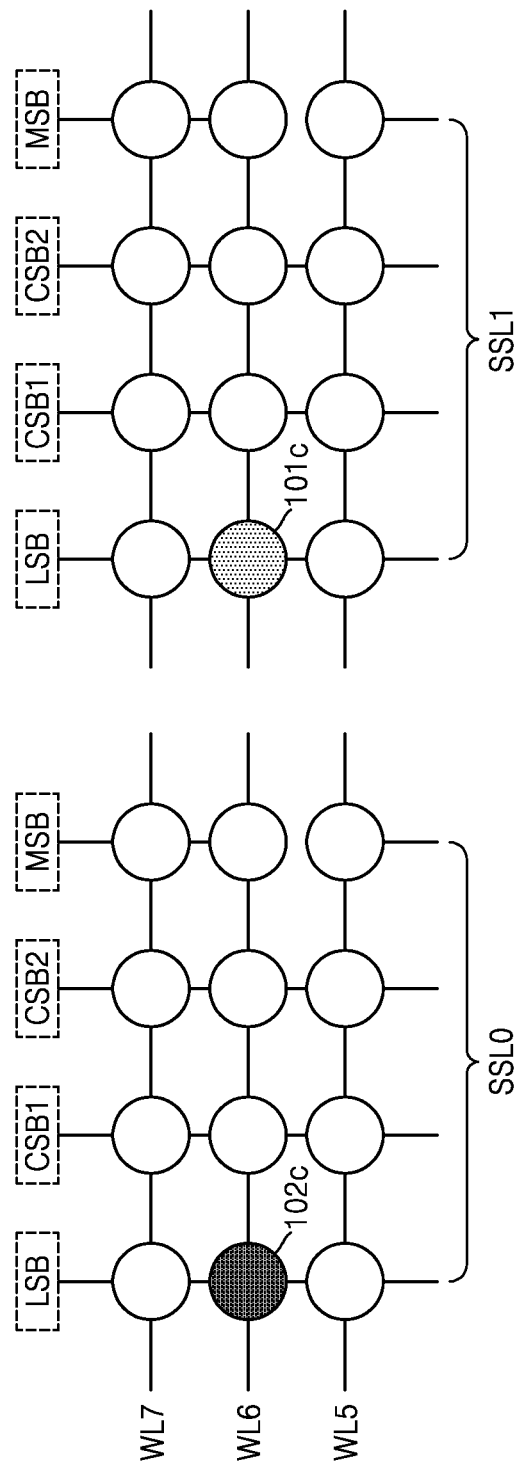

FIG. 13C illustrates a case in which the first memory page 101c and the second memory page 102c are respectively connected to two string selection lines adjacent to one another. That is, in FIG. 13C, the string selection lines SSL0 and SSL1 are physically next to one another, with no other string selection line physically therebetween. In this case, referring together to FIG. 12, the memory device 10 may select the offset level compensation table OLC_TABLE as a third offset level compensation table OLC_TABLE_3.

Figure 13D:
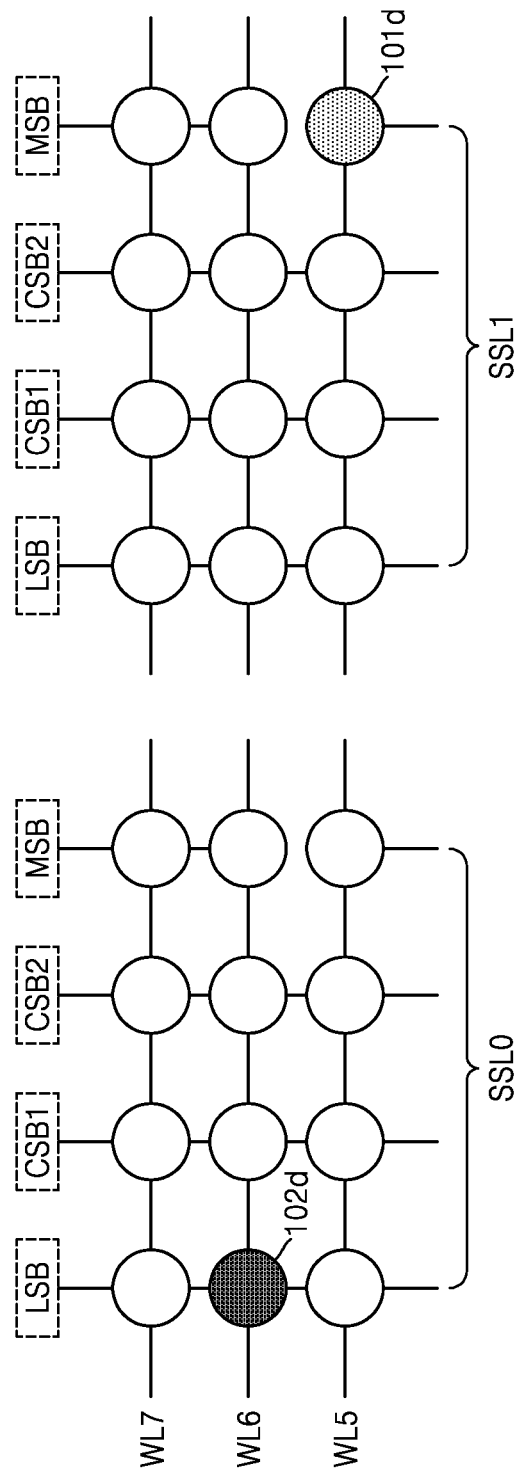

FIG. 13D illustrates a case in which a first memory page 101d and a second memory page 102d are respectively connected to two adjacent word lines and two adjacent string selection lines. That is, in FIG. 13D, the string selection lines SSL0 and SSL1 are physically next to one another, with no other string selection line physically therebetween. In this case, referring together to FIG. 12, the memory device 10 may select the offset level compensation table OLC_TABLE as a fourth offset level compensation table OLC_TABLE_4.

Figure 14:
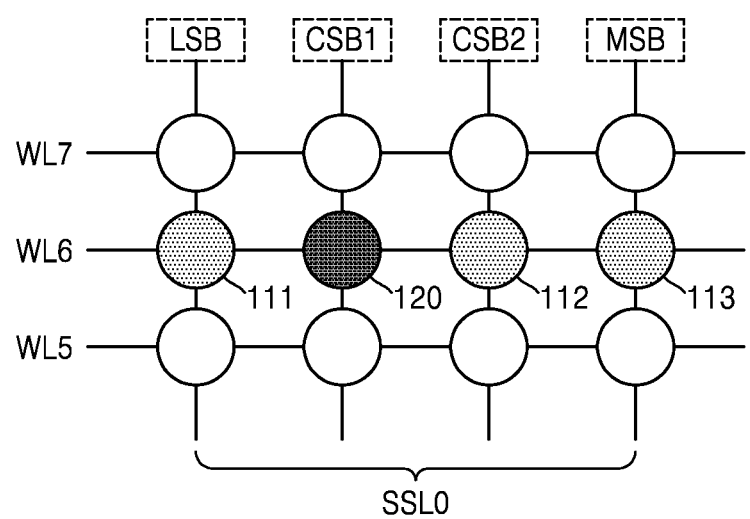
FIG. 14 illustrates a part of the memory cell array according to an example embodiment.

FIG. 14 illustrates a part of the memory cell array 100 according to an example embodiment. FIG. 14 illustrates a part of the cell array of a case in which multiple determination results of distribution degradation for determining the second level in the operation S260 of FIG. 9.

Referring to FIG. 14, when determining a dummy read voltage in the second read operation section, in which a read operation with respect to the second memory page 120 is performed, it is possible to use determination results of distribution degradation with respect to memory pages included in one (i.e., the same) physical memory page. That is, in determining a dummy read voltage with respect to the second memory page 120, determination results of distribution degradation in the LSB page 111, the CSB2 page 112, and the MSB page 113 may be synthesized and used.

FIG. 15 illustrates the offset level compensation table OLC_TABLE according to an example embodiment. Each of the first through fourth offset level compensation tables shown in FIG. 12 may be the offset level compensation table OLC_TABLE of FIG. 15. The offset level compensation table OLC_TABLE may include offset level compensation values corresponding to a range of the threshold voltage distribution degradation degree DDD.

A first reference degradation degree DDD_ref1 and a second reference degradation degree DDD_ref2 may respectively indicate reference values used for determining read offset levels described in the operation S140 of FIG. 6. The offset level of the dummy read voltage, when the threshold voltage distribution degradation degree DDD is near the reference values, may have a large amount of profit to compensate. Accordingly, when a gap value between the threshold voltage distribution degradation degree DDD and the reference values, such as the first reference degradation degree DDD_ref1 and the second reference degradation degree DDD_ref2, is in a certain range, a value of the offset level may be determined. Offset level compensation values may have a value of a natural number times of the word line voltage variable unit.

FIG. 16 illustrates an offset level compensation table OLC_TABLE according to an example embodiment. FIG. 16, for convenience of explanation, particularly illustrates a case in which there are five reference values used for determining the read offset level described in the operation S140 of FIG. 6. Also, for convenience of explanation, FIG. 16 illustrates a case of assuming that the valid word line voltage variable unit that has been described above is three times the word line voltage variable unit dV_WL. However, these numeral values are merely for convenience of explanation, and the embodiments of the present disclosure should not be construed as limited thereto.

When a gap between the threshold voltage distribution degradation degree DDD and the first reference degradation degree DDD_ref1 is less than d, the offset level compensation value may be determined as the word line voltage variable unit dV_WL. Also, when a gap between the threshold voltage distribution degradation degree DDD and the first reference degradation degree DDD_ref1 is equal to or greater than d and less than 2*d, the offset level compensation value may be determined as twice the word line voltage variable unit dV_WL.

Likewise, when a gap between the threshold voltage distribution degradation degree DDD and the second reference degradation degree DDD_ref2 is less than d, the offset level compensation level may be determined as the word line voltage variable unit dV_WL. Also, when the gap between the threshold voltage distribution degradation degree DDD and the second reference degradation degree DDD_ref2 is equal to or greater than d and less than 2*d, the offset level compensation value may be determined as twice the word line voltage variable unit dV_WL. Other cases may be understood in the same manner.

According to what is shown in FIG. 16, when the threshold voltage distribution degradation degree DDD is near the reference value, offset level compensation values near the first reference degradation degree DDD_ref1 through the fifth reference degradation degree DDD_ref2 are identical to one another to compensate for the offset level of the dummy read voltage in the word line voltage variable units dV_WL.

However, the embodiment of FIG. 16 is merely an example, and the offset level compensation values near the first reference degradation degree DDD_ref1 through the fifth reference degradation degree DDD_ref5 may be different from one another.

As described above, even when performing multiple sensing operations by changing develop time of the senseout node as in a method with reference to FIG. 8, like in FIG. 16, by adjusting the offset level of the dummy read voltage in the word line voltage variable units, the dummy read operations may be elaborately controlled. Accordingly, reliability in the dummy read operations may be improved, and reliability in the read operation of the memory device may also be improved.

Figure 17:
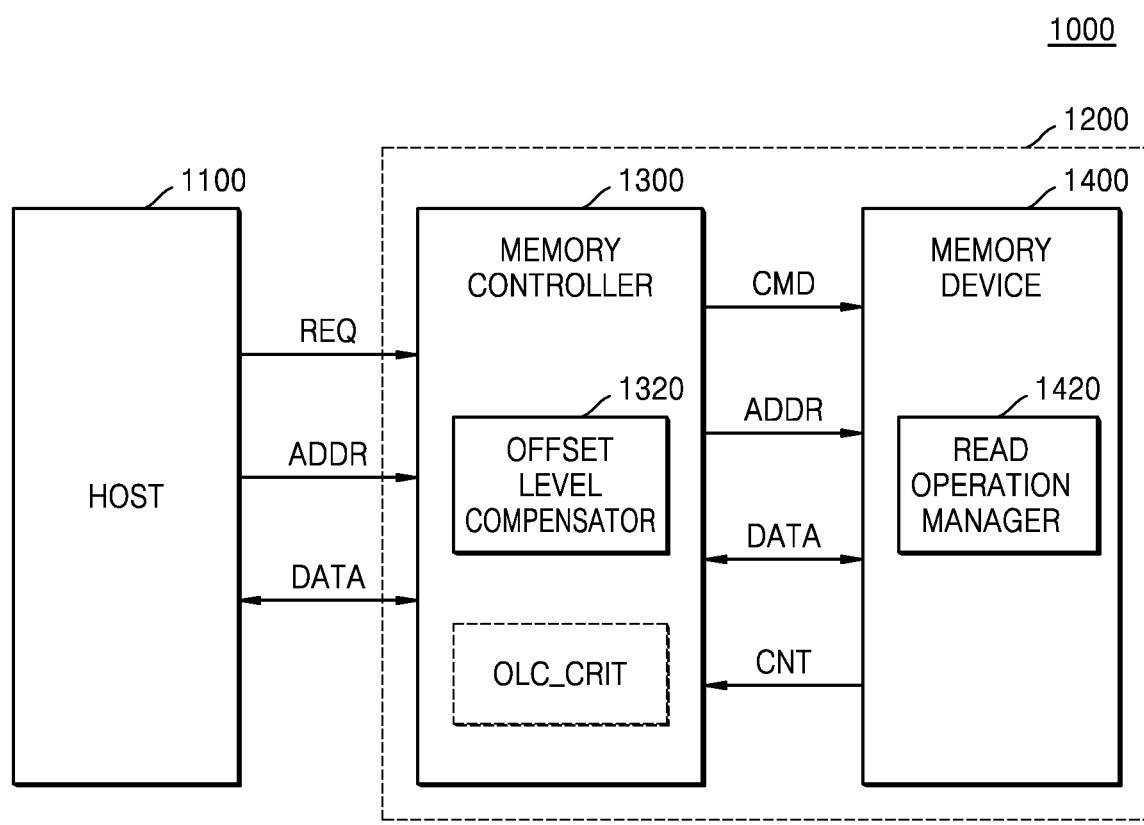
FIG. 17 illustrates a system according to an example embodiment.

FIG. 17 illustrates a system 1000 according to an example embodiment. The system 1000 may include a host 1100 and a memory system 1200. The memory system 1200 may include a memory controller 1300 and a memory device 1400. Except for description about a read operation manager of the memory device 1400, descriptions overlapping with those of FIG. 1 are omitted. The system 1000 may be provided as one of various computer systems such as ultra mobile PC (UMPC), work station, net-book, personal digital assistants (PDA), portable computer, web tablet, wireless phone, mobile phone, smart phone, e-book, portable multi-media player (PMP), handheld game console, navigation apparatus, black box, and digital camera.

Each of the host 1100, the memory controller 1300, and the memory device 1400 may be provided as a chip, a package, or a module, and so on. However, the aforementioned components are not limited thereto, and for example, the memory controller 1300 may, together with the host 1100, be provided as an application processor. As another example, the memory controller 1300 may, together with the memory device 1400, be provided as the memory system 1200 or a storage device.

Additionally, an application processor for a memory controller 1300 and any other processor described herein is tangible and non-transitory. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. A processor is an article of manufacture and/or a machine component. A processor is configured to execute software instructions to perform functions as described in the various embodiments herein. A processor may be a general-purpose processor or may be part of an application specific integrated circuit (ASIC). A processor may also be a microprocessor, a microcomputer, a processor chip, a controller, a microcontroller, a digital signal processor (DSP), a state machine, or a programmable logic device. A processor may also be a logical circuit, including a programmable gate array (PGA) such as a field programmable gate array (FPGA), or another type of circuit that includes discrete gate and/or transistor logic. Additionally, any processor described herein may include multiple processors, parallel processors, or both. Multiple processors may be included in, or coupled to, a single device or multiple devices.

The host 1100 may transmit data operation request REQ and an address ADDR to the memory controller 1300, and may exchange data with the memory controller 1300. For example, the host 1100 may exchange data with the memory controller 1300, based on at least one of various interface protocols including universal serial bus (USB) protocol, multi-media card (MMC) protocol, peripheral component interconnection (PCI) protocol, PCI-express (PCI-E) protocol, advanced technology attachment (ATA) protocol, serial-ATA protocol, parallel-ATA protocol, small computer small interface (SCSI) protocol, enhanced small device interface (ESDI) protocol, integrated drive electronics (IDE) protocol, mobile industry processor interface (MIPI) protocol, and universal flash storage (UFS) protocol, and so on.

The memory controller 1300 may, in response to the request of the host 1100, control the memory device 1400. For example, the memory controller 1300 may control the memory device 1400 to read data DATA stored in the memory device 1400 in response to a data operation request REQ received from the host 1100 or to write data DATA to the memory device 1400. The memory controller 1300 may, by providing an address ADDR, a command CMD, and a control signal to the memory device 1400, control writing operations, reading operations, and erasing operations of the memory device 1400. Also, data DATA required for the aforementioned operations may be exchanged between the memory controller 1300 and the memory device 1400.

The memory controller 1300 may receive count information CNT from the memory device 1400. For example, the memory device 1400 may, through data line, transmit the count information CNT to the memory controller 1300. However, the transmission of the count information CNT is not limited thereto, and the memory device 1400 may, according to a status command method, transmit the count information CNT along with an answer in response to a status command signal received from the memory controller 1300. The count information CNT may indicate a result value of the cell count operation by the cell counter of the memory device 1400 after the dummy read voltage is applied to the first word line in the first read operation section. The memory controller 1300 may, based on the count information CNT, determine degradation degree of the threshold voltage distribution of the memory cells connected to the first word line. The offset level compensator 1320 included in the memory controller 1300 may determine an offset level value, by comparing the degradation degree of the threshold voltage. The memory controller 1300 may transmit the offset level compensation value when transmitting a read command with respect to the second read operation to the memory device 1400. The memory device 1400 may perform a dummy read operation by adjusting an offset level by using the received offset level compensation value.

In other words, compared to the memory device described with reference to FIGS. 1 through 16, FIG. 17 has a difference in a sense that a subject of determining the offset level compensation value is changed to the memory controller 1300.

Figure 18:
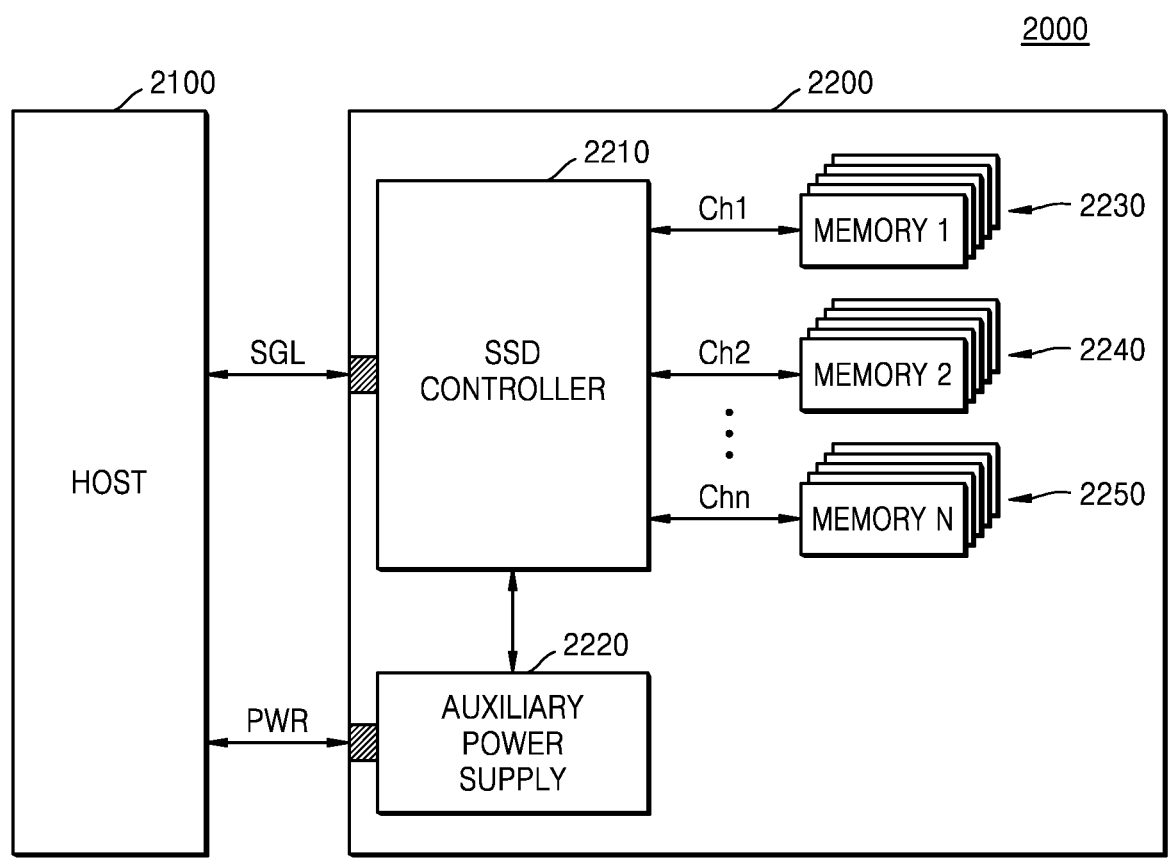
FIG. 18 illustrates a solid state drive (SSD) system according to an example embodiment.

FIG. 18 illustrates an SSD system 2000 according to an example embodiment.

The SSD system 2000 may include a host 2100 and an SSD 2200. The SSD 2200 may, through a signal connector, exchange signals with the host 2100. The SSD 2200 may also receive input through a power connector. The SSD 2200 may include an SSD controller 2110, an auxiliary power supply 2220, and multiple memory devices 2230, 2240, and 2250. In this case, the SSD 2200 may be implemented by using the embodiments shown in FIGS. 1 through 17.

In detail, according to the embodiments shown in FIGS. 1 through 17, each of the memory devices 2230, 2240, and 2250 may include a read operation manager. The read operation managers included in the memory devices may store threshold voltage distribution degradation degrees determined based on a dummy read operation of a previous read operation section. The read operation managers may also adjust an offset level of a dummy read voltage used for a dummy read operation in a next read operation, by using the stored threshold voltage distribution degradation degrees. By adjusting the offset level of the dummy read voltage, reliability in the dummy read operation of the memory device may be improved, and reliability in read operations of the memory device may be improved.

Figure 19:
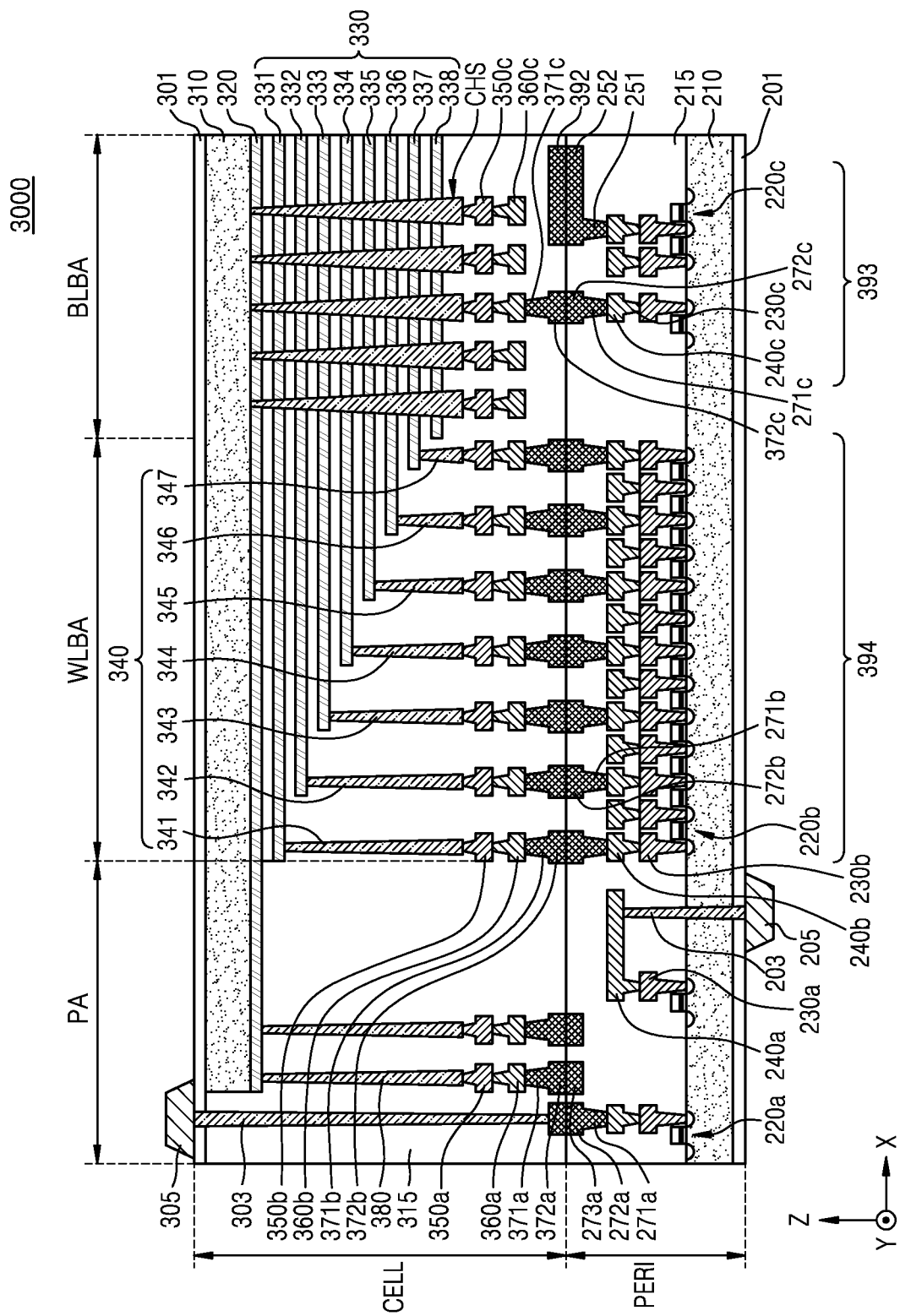
FIG. 19 illustrates a memory device having a chip-to-chip (C2C) structure, according to exemplary embodiments of the inventive concept.

Referring to FIG. 19, a memory device 3000 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 40 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high resistance, and the second metal layers 240a, 240b, and 240c may be formed of copper having relatively low resistance.

In an example embodiment illustrate in FIG. 19, although the first metal layers 230a, 230b, and 230c and the second metal layers 240a, 240b, and 240c are shown and described, they are not limited thereto, and one or more metal layers may be further formed on the second metal layers 240a, 240b, and 240c. At least a portion of the one or more metal layers formed on the second metal layers 240a, 240b, and 240c may be formed of aluminum or the like having a lower resistance than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically connected to c in a bonding manner, and the lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction, perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In an example embodiment illustrated in FIG. 19, an area in which the channel structure CH, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b providing a row decoder 394 in the peripheral circuit region PERI. In an example embodiment, operating voltages of the circuit elements 220b providing the row decoder 394 may be different than operating voltages of the circuit elements 220c providing the page buffer 393. For example, operating voltages of the circuit elements 220c providing the page buffer 393 may be greater than operating voltages of the circuit elements 220b providing the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 19, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 19, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303.

According to embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 19, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 205 and the second input-output pad 305 may be selectively formed. For example, the memory device 3000 may include only the first input-output pad 205 disposed on the first substrate 210 or the second input-output pad 305 disposed on the second substrate 310. Alternatively, the memory device 3000 may include both the first input-output pad 205 and the second input-output pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 3000 may include a lower metal pattern 273a, corresponding to an upper metal pattern 372a formed in an uppermost metal layer of the cell region CELL, and having the same shape as the upper metal pattern 372a of the cell region CELL, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu—Cu bonding.

Further, the bit line bonding area BLBA, an upper metal pattern 392, corresponding to a lower metal pattern 252 formed in the uppermost metal layer of the peripheral circuit region PERI, and having the same shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

While the inventive concept(s) of the present disclosure have been particularly shown and described with reference to embodiments thereof, it will be understood that various changes in form and details may be made therein without departing from the spirit and scope of the following claims.

What is claimed is:

1. A method of operating a memory device comprising a plurality of word lines, the memory device comprising a memory cell region including a first metal pad and a peripheral circuit region including a second metal pad and vertically connected to the memory cell region by the first metal pad and the second metal pad, the method comprising:
performing, in a first read operation, a first dummy read operation on first memory cells connected to a first word line among the plurality of word lines, by applying a dummy read voltage, having an offset level of a first level, to the first word line among the plurality of word lines;
determining, based on read results of the first dummy read operation, degradation of a threshold voltage distribution of the first memory cells connected to the first word line;
adjusting an offset level of the dummy read voltage as a second level, based on a result of the determining of the degradation of the threshold voltage distribution of the first memory cells; and
performing, in a second read operation, a second dummy read operation on second memory cells connected to a second word line among the plurality of word lines, by applying the dummy read voltage having the offset level, adjusted as the second level, to the second word line among the plurality of word lines.

2. The method of claim 1, wherein
the determining of the degradation of the threshold voltage distribution comprises:
performing a first cell counting operation corresponding to the first dummy read operation; and determining, based on count information indicating a result of the performing of the first cell counting operation, degradation degree of the threshold voltage distribution of the first memory cells.

3. The method of claim 2, wherein
the performing of the first dummy read operation comprises performing a plurality of sensing operations by applying, to the first word line, a plurality of word line voltages respectively having a voltage gap of a valid word line voltage variable unit, and
the performing of the first cell counting operation comprises counting a number of memory cells having threshold voltages between the plurality of word line voltages on the threshold voltage distribution among the first memory cells.

4. The method of claim 2, wherein the adjusting of the offset level of the dummy read voltage as the second level comprises:
determining the offset level of the dummy read voltage as the second level, by comparing the degradation degree of the threshold voltage distribution of the first memory cells to an offset level compensation table stored in the memory device.

5. The method of claim 4, wherein the determining of the offset level of the dummy read voltage as the second level comprises:
selecting the offset level compensation table, based on adjacency between the first memory cells and the second memory cells, from offset level compensation criterion information stored in the memory device; and
determining the offset level of the dummy read voltage as the second level, by comparing the degradation degree of the threshold voltage distribution of the first memory cells to the selected offset level compensation table.

6. The method of claim 1, wherein
the first metal pad and the second metal pad formed of copper.

7. The method of claim 1, wherein
the first metal pad and the second metal pad are connected by bonding manner.

8. The method of claim 1, wherein
wherein the memory cell region is formed on a first wafer and the peripheral circuit region is formed on a second wafer.

9. The method of claim 1, wherein
the plurality of word lines are each connected to a plurality of memory cells of a memory cell array in the memory cell region, and
the performing of the first dummy read operation comprises, after performing bit line precharge once, performing sensing operations multiple times by using different develop time periods of a senseout node of a page buffer in the memory cell region connected to the memory cell array.

10. The method of claim 9, wherein a first voltage gap indicates a valid word line voltage resolution corresponding to a develop time period resolution of the senseout node, and
the adjusting of the offset level of the dummy read voltage as the second level comprises determining the second level in a second voltage gap smaller than the first voltage gap.

11. The method of claim 10, wherein
the first voltage gap is a first multiple of the second voltage gap by a first natural number equal to or greater than 2, and
in the adjusting the offset level of the dummy read voltage as the second level, the second level is a second multiple of the second voltage gap by a second natural number less than or equal to one less than the first natural number.

12. A memory device, comprising:
a memory cell region including a first metal pad;
a peripheral circuit region including a second metal pad and vertically connected to the memory cell region by the first metal pad and the second metal pad;
a memory cell array in the memory cell region comprising a plurality of memory cells connected to each of a plurality of word lines;
a page buffer circuit in the peripheral circuit region comprising a plurality of page buffers respectively connected to first memory cells, connected to a first word line among the plurality of word lines, and configured to store results of reading the first memory cells during performance of a first dummy read operation in a first read operation with respect to the first word line;
a cell counter connected to the page buffer circuit and configured to perform, according to results of reading the first memory cells, a first cell counting operation corresponding to the first dummy read operation; and
a control logic circuit in the peripheral circuit region configured to determine degradation of a threshold voltage distribution of the first memory cells, based on count information received from the cell counter and representing a result of performing of the cell counting operation, store a result of determining degradation of the threshold voltage distribution of the first memory cells as a store result, and adjust an offset level of a dummy read voltage used for a second read dummy operation, based on the store result of determining degradation of the threshold voltage distribution of the first memory cells, in a second read operation with respect to second memory cells connected to a second word line among the plurality of word lines.

13. The memory device of claim 12, wherein
the first dummy read operation comprises a plurality of sensing operations performed by applying, to the first word line, a plurality of word line voltages respectively having voltage gaps of a valid word line voltage variable unit, and
the cell counter, among the first memory cells, counts a number of memory cells having a threshold voltage among the plurality of word line voltages in a threshold voltage distribution and provides the number of the memory cells having the threshold voltage to the control logic circuit as the count information.

14. The memory device of claim 12, wherein
the control logic circuit stores degradation degree of the threshold voltage distribution of the first memory cells as the result of determining degradation of the threshold voltage distribution of the first memory cells and adjust an offset level of the dummy read voltage by comparing the degradation degree of the threshold voltage distribution of the first memory cells to an offset level compensation table stored in the memory device.

15. The memory device of claim 12, wherein
the first metal pad and the second metal pad formed of copper.

16. The memory device of claim 12, wherein
the first metal pad and the second metal pad are connected by bonding manner.

17. The memory device of claim 12, wherein
wherein the memory cell region is formed on a first wafer and the peripheral circuit region is formed on a second wafer.

18. The memory device of claim 12, wherein
the page buffer circuit, after performing precharge once with respect to bit lines of the memory device, and performs a plurality of sensing operations by changing a develop time period of a senseout node of the page buffer circuit.

* * * * *